US011114990B2

(12) United States Patent
Paul et al.

(10) Patent No.: US 11,114,990 B2
(45) Date of Patent: Sep. 7, 2021

(54) APPARATUS AND METHOD OF POWER MANAGEMENT USING ENVELOPE STACKING

(71) Applicant: Anokiwave, Inc., San Diego, CA (US)

(72) Inventors: Susanne Paul, Billerica, MA (US); Akhil Garlapati, Billerica, MA (US); Yan Li, Billerica, MA (US)

(73) Assignee: Anokiwave, Inc., San Diego, CA (US)

( * ) Notice: Subject to any disclaimer, the term of this patent is extended or adjusted under 35 U.S.C. 154(b) by 0 days.

(21) Appl. No.: 16/991,673

(22) Filed: Aug. 12, 2020

(65) Prior Publication Data

US 2021/0050828 A1 Feb. 18, 2021

Related U.S. Application Data

(60) Provisional application No. 62/885,638, filed on Aug. 12, 2019.

(51) Int. Cl.
  *H03F 3/04* (2006.01)
  *H03F 3/24* (2006.01)
  *H03F 3/195* (2006.01)

(52) U.S. Cl.
  CPC ............. *H03F 3/245* (2013.01); *H03F 3/195* (2013.01); *H03F 2200/102* (2013.01); *H03F 2200/252* (2013.01); *H03F 2200/451* (2013.01); *H03F 2200/504* (2013.01)

(58) Field of Classification Search
  CPC ........ H03F 3/16; H03F 3/68; H03F 2200/504; H03F 1/0211
  USPC ................................. 330/277, 295, 310, 297
  See application file for complete search history.

(56) References Cited

U.S. PATENT DOCUMENTS

| 6,232,848 | B1 * | 5/2001 | Manku ................. H03D 7/1433 333/176 |
| 9,037,101 | B1 | 5/2015 | Somashekar et al. |
| 9,431,975 | B2 * | 8/2016 | Chakrabarti .......... H03F 3/2176 |
| 2005/0068103 | A1 | 3/2005 | Dupuis et al. |
| 2011/0051842 | A1 | 3/2011 | van der Heijden et al. |

(Continued)

OTHER PUBLICATIONS

Israel Patent Office, International Searching Authority, International Search Report—for Application No. PCT/US2020/045945, dated Nov. 30, 2020, together with the Written Opinion of the International Searching Authority, 12 pages.

(Continued)

*Primary Examiner* — Steven J Mottola
(74) *Attorney, Agent, or Firm* — Nutter McClennen & Fish LLP

(57) ABSTRACT

An envelope stacking power amplifier system reduces current for a given output power level without sacrificing the ability to support large voltage swings at saturation and therefore increases efficiency at the maximum linear operating power and all power levels below that. The system includes a stack/unstack controller including circuitry configured to switch the RF power amplifier system between a stacked mode in which first and second RF amplifiers are coupled in a stacked configuration and an unstacked mode in which the first and second RF amplifiers are coupled in an unstacked configuration in response to one or more mode-control signals, the stacked configuration providing reduced current compared to the unstacked configuration.

20 Claims, 17 Drawing Sheets

Block diagram of a first preferred embodiment of an envelope stacking system

(56) References Cited

U.S. PATENT DOCUMENTS

2016/0065142 A1   3/2016  Paek et al.
2017/0288609 A1   10/2017 Soliman

OTHER PUBLICATIONS

Woo, Jung-Lin, et al., "Dynamic Stack-Controlled CMOS RF Power Amplifier for Wideband Envelope Tracking," IEEE Transactions on Microwave Theory and Techniques, vol. 62, Issue No. 12, pp. 3452-3464 (2014).

* cited by examiner

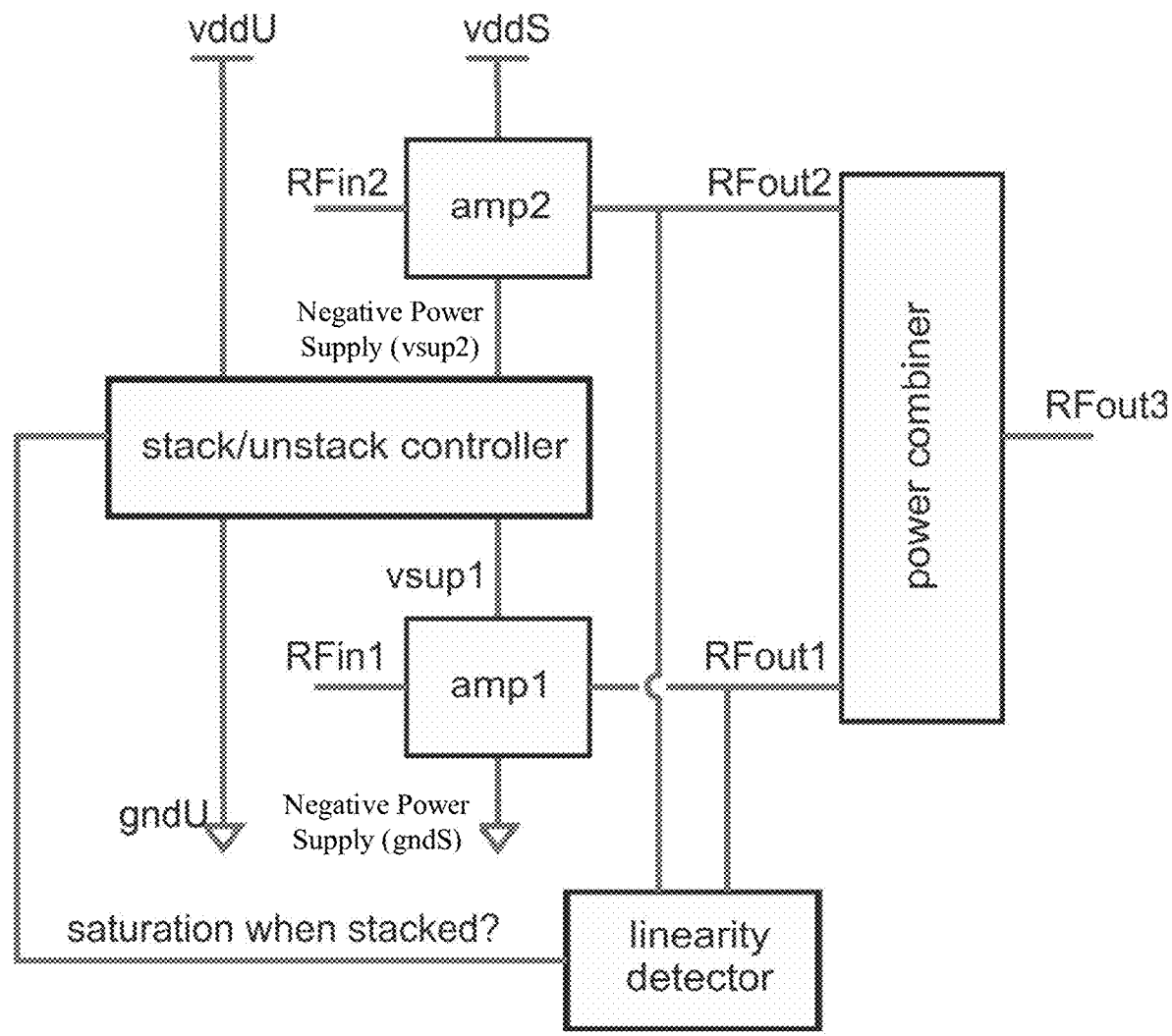
Figure 1: Block diagram of a first preferred embodiment of an envelope stacking system

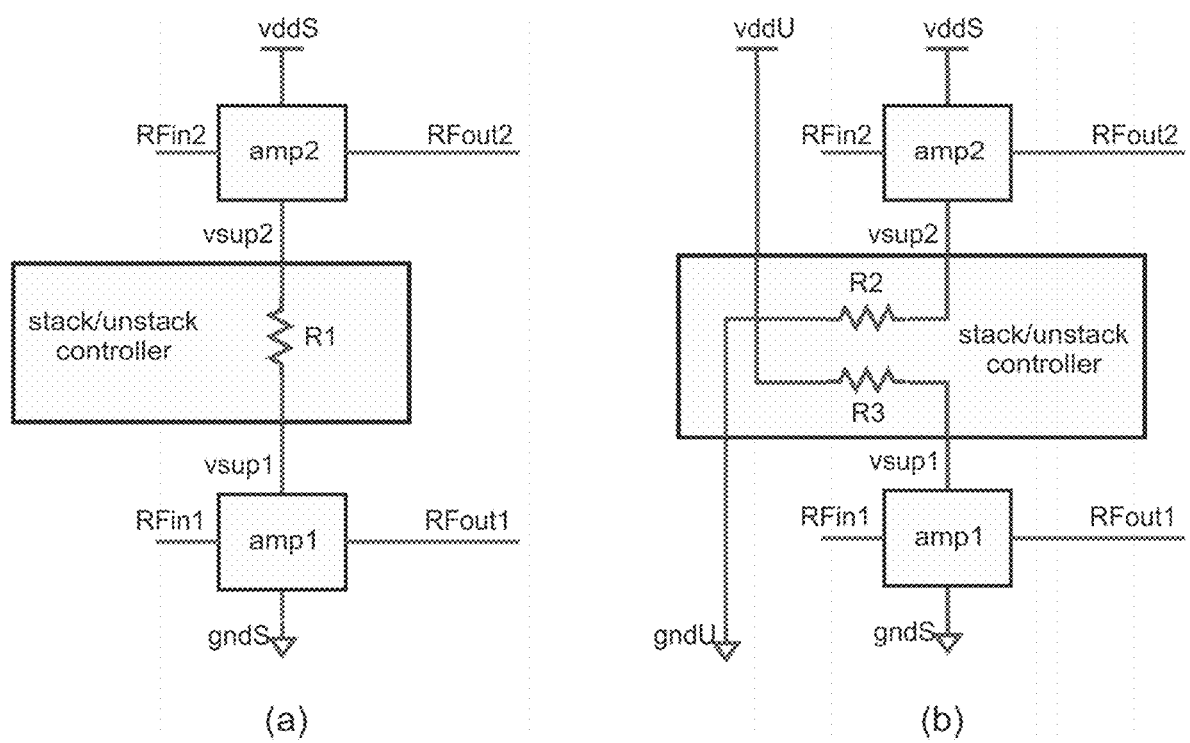
Figure 2: Behavioral model of stack/unstack controller when stacked (a) and when unstacked (b).

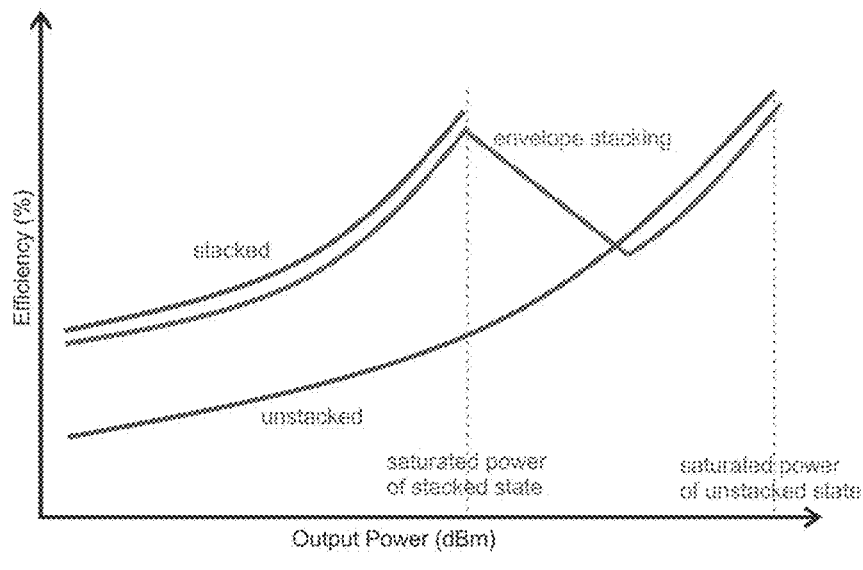
(a)
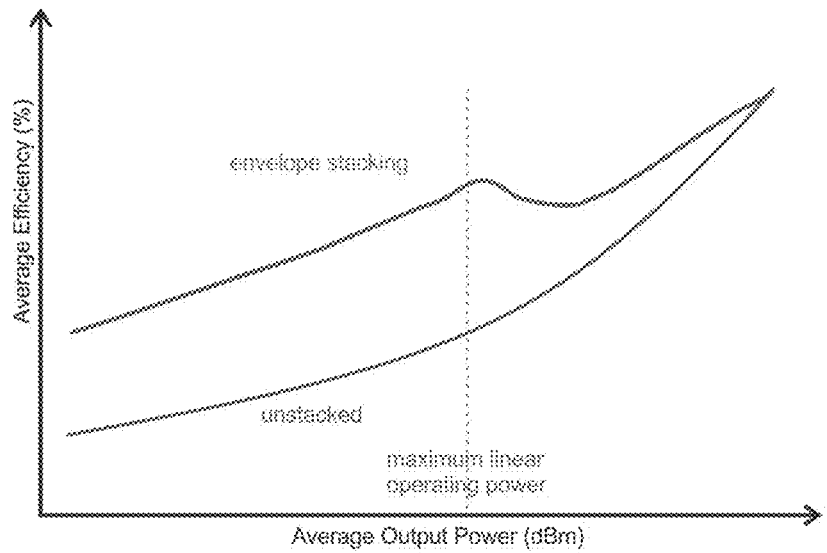
(b)
Figure 3: Efficiency characteristics of stacked, unstacked, and envelope stacking RF amplifiers. (a) for a CW waveform; (b) for a modulated waveform.

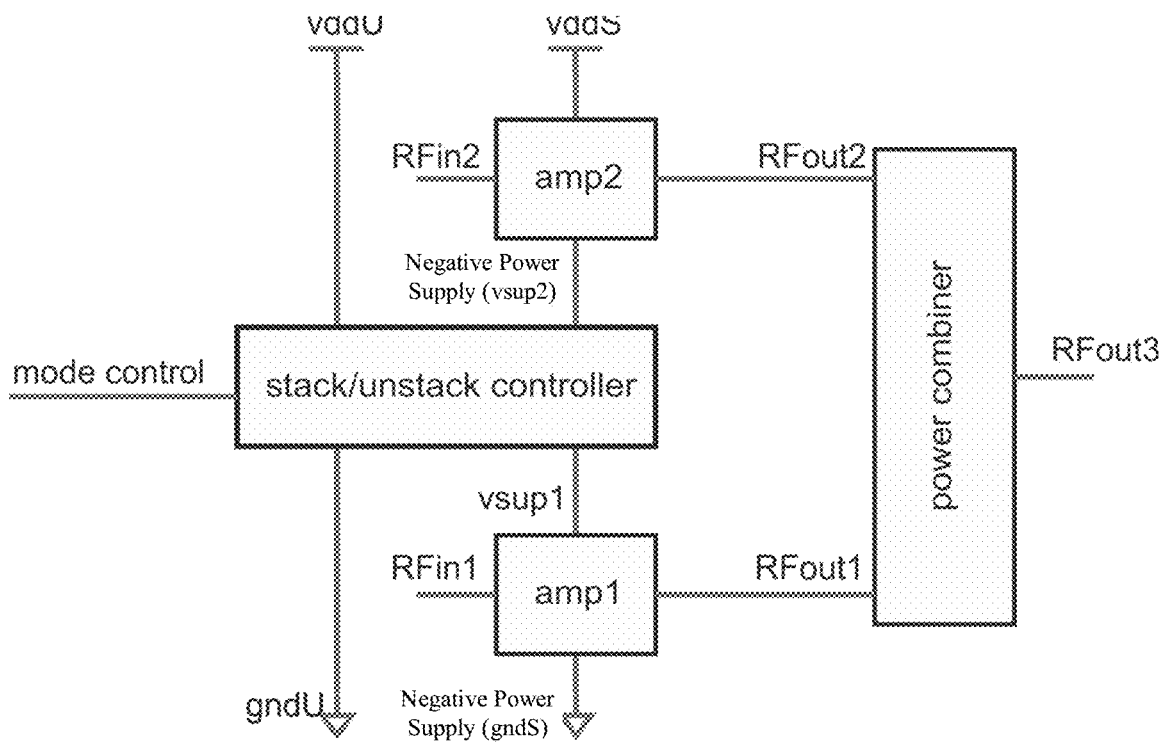
Figure 4: Block diagram of a second preferred embodiment of an envelope stacking system with externally provided mode control
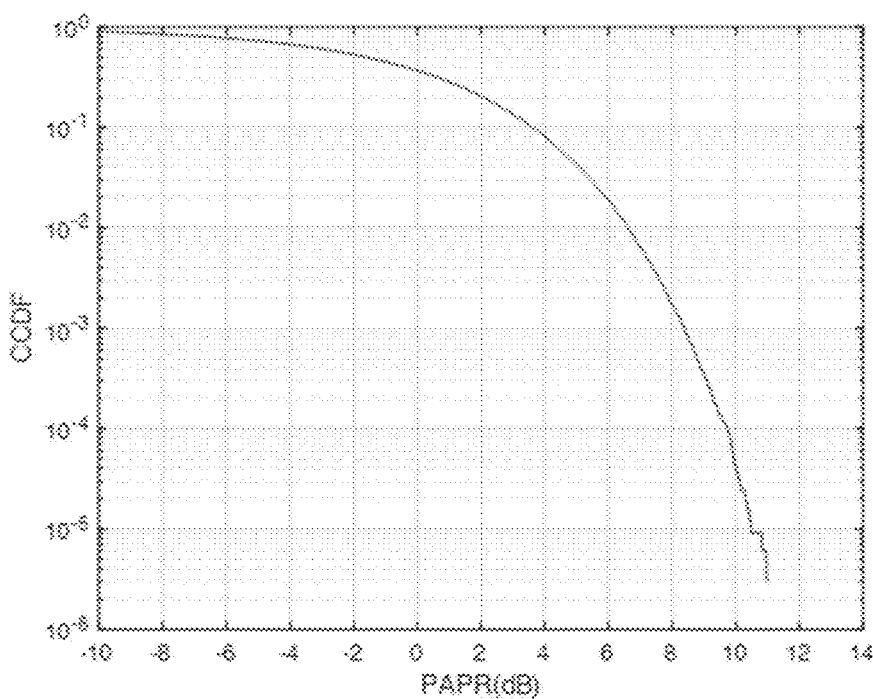
Figure 5: CCDF for a CP-OFDM signal with 256-QAM

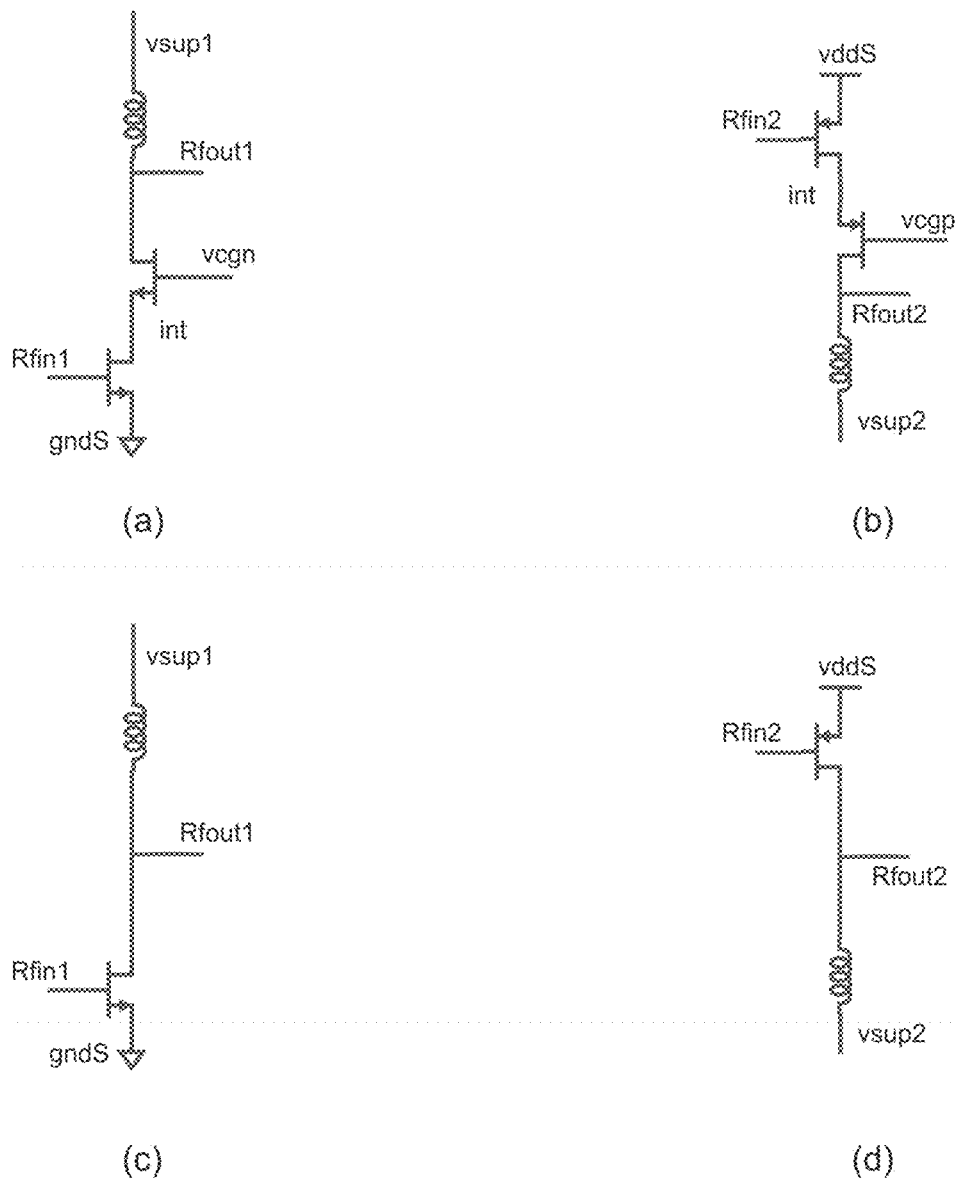
Figure 6: Examples of single-ended amplifier circuits for first and second amplifiers

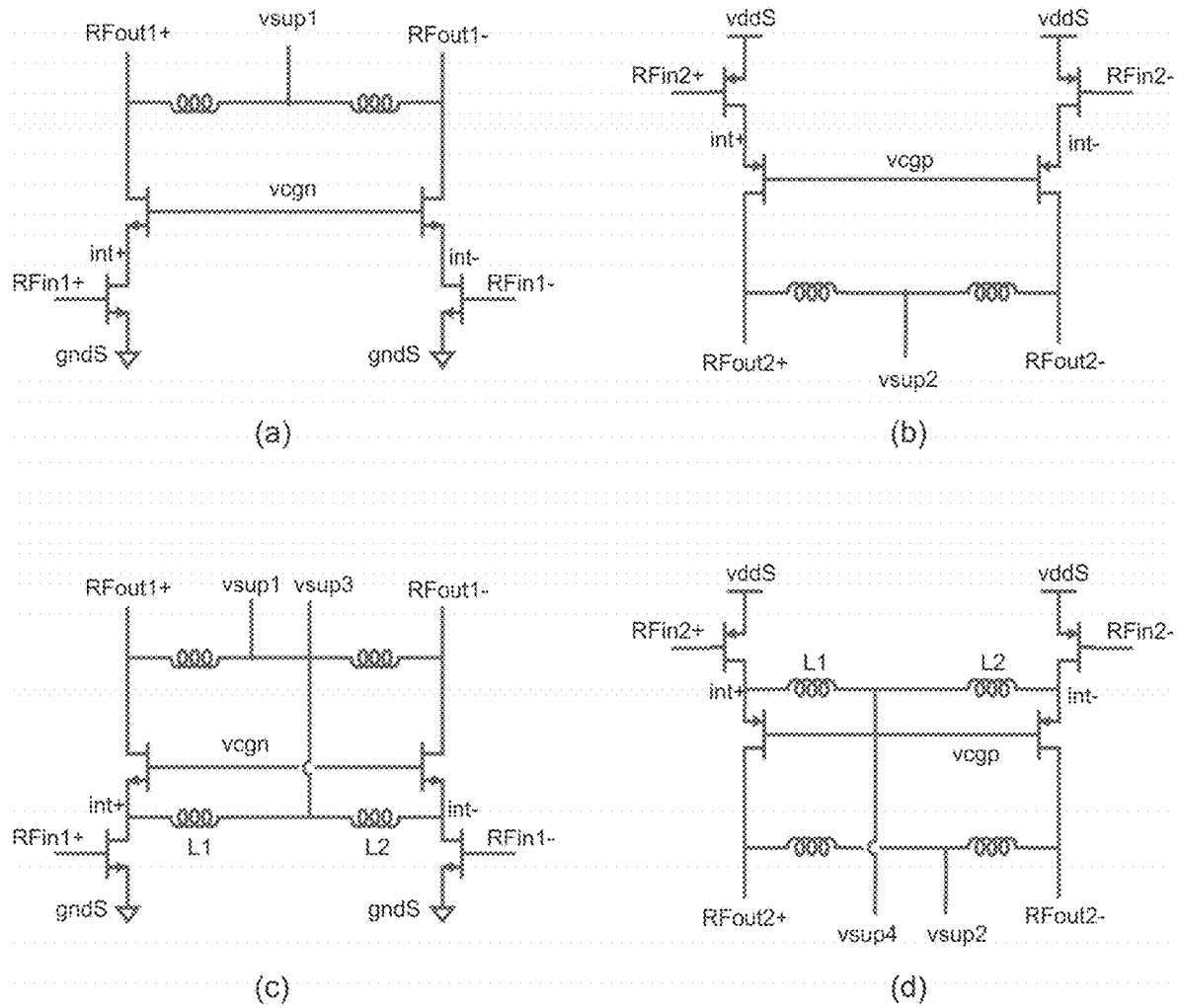
Figure 7: Examples of differential amplifier circuits for first and second amplifiers

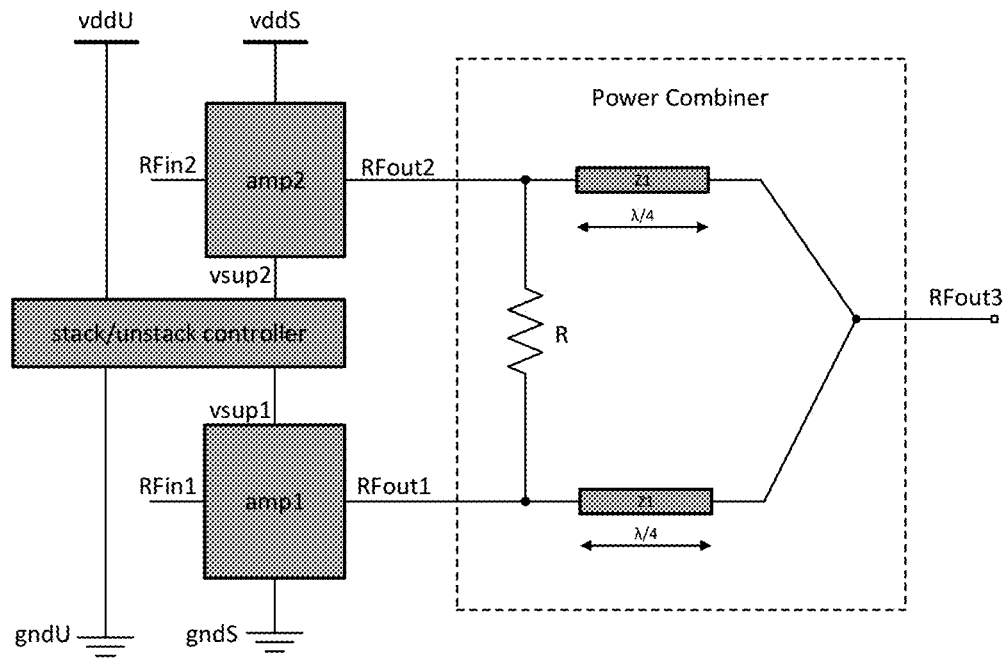
Figure 8: Embodiment of power combining for single-ended RF amplifiers using Wilkinson combiner
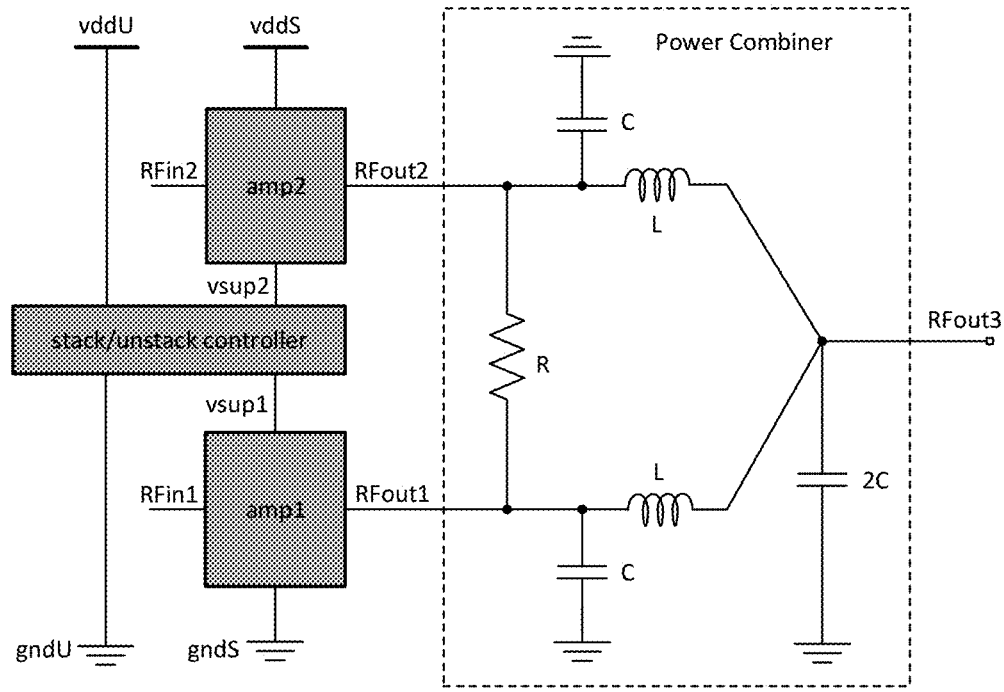
Figure 9: Embodiment of power combining for single-ended RF amplifiers using lumped elements

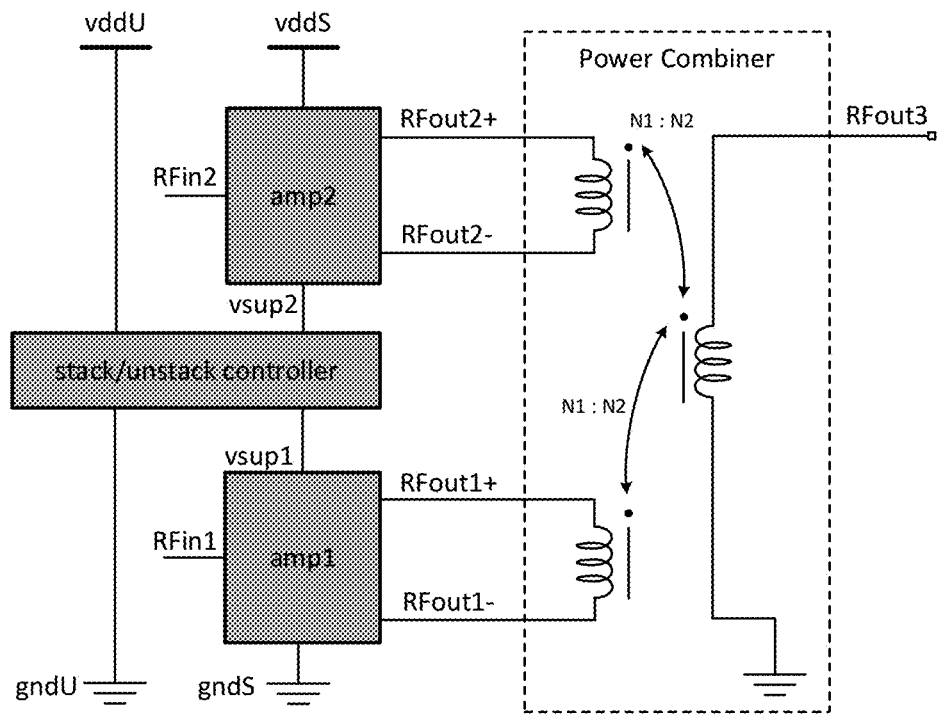
Figure 10: Embodiment of power combining for differential RF amplifier using a parallel-combining transformer
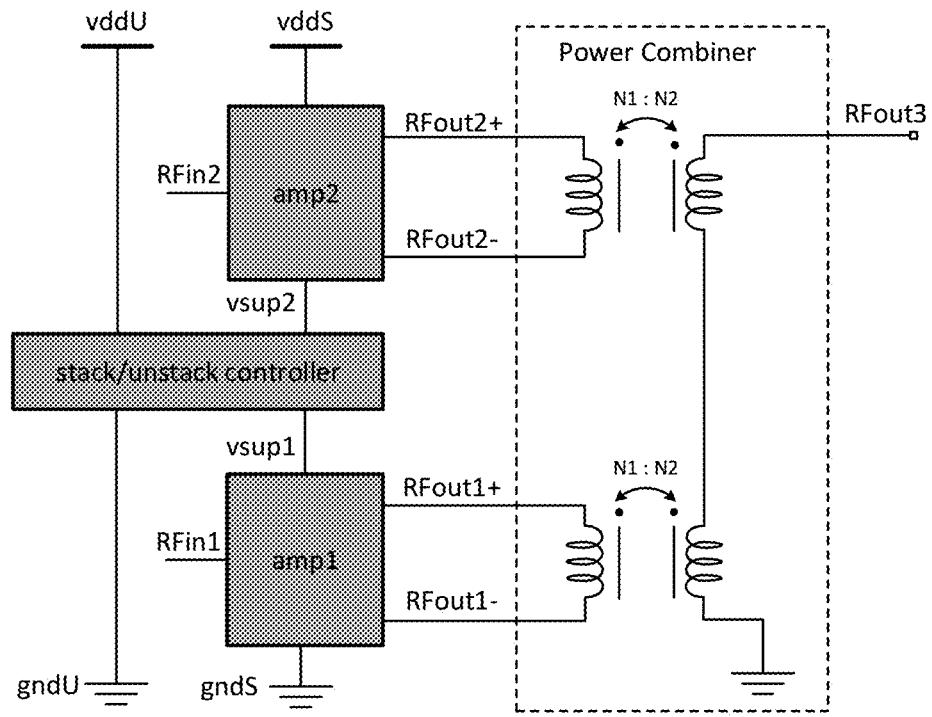
Figure 11: Embodiment of power combining for differential RF amplifiers using a series-combining transformer

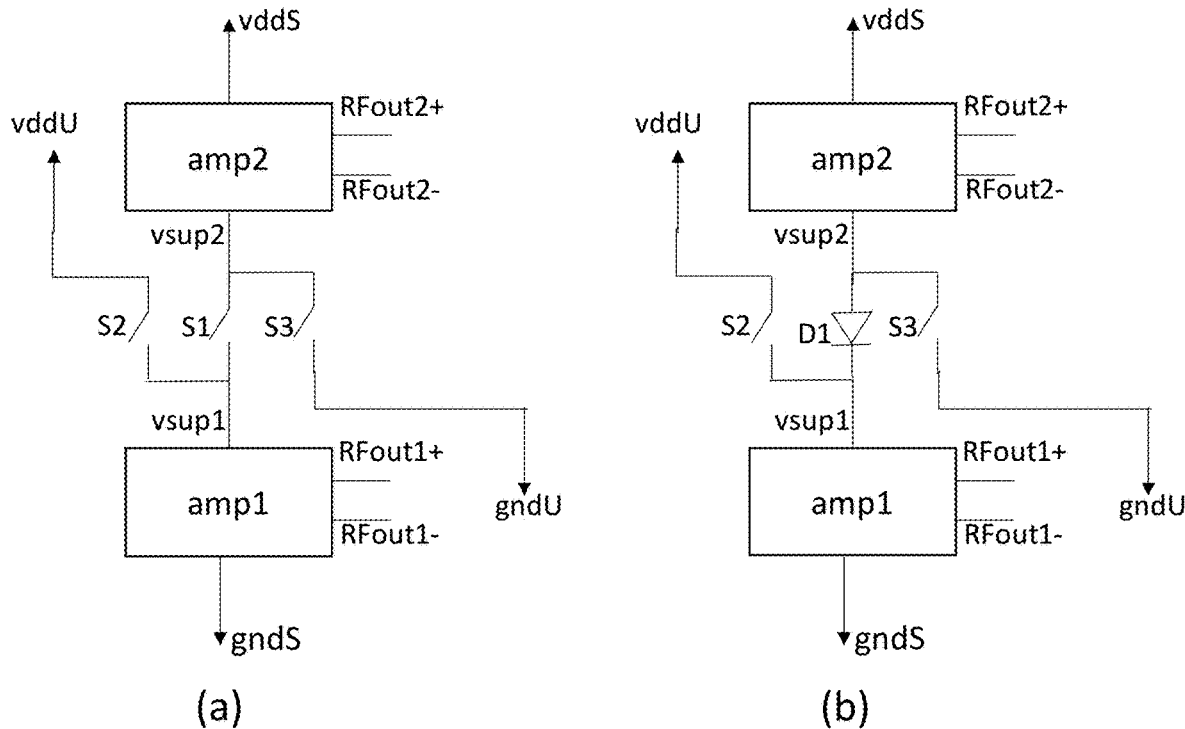
Figure 12: Preferred embodiment of a stack/unstack controller. (a) switch configuration; (b) diode configuration
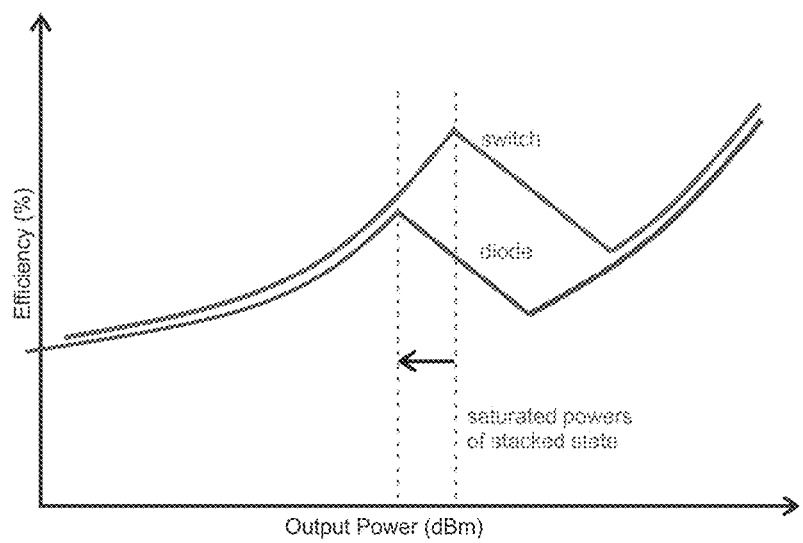
Figure 13: Impact of diode drop on envelope stacking efficiency vs. power.

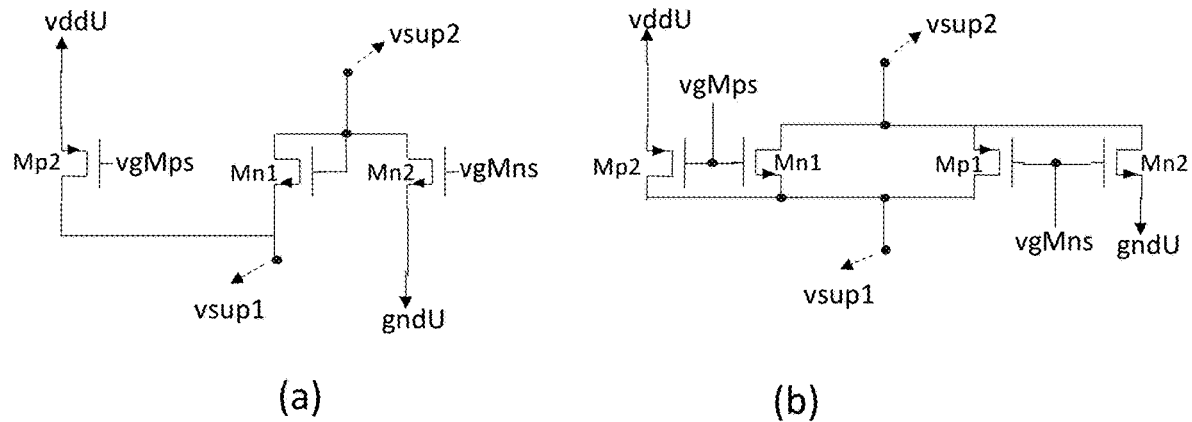
Figure 14: Embodiments of the stack/unstack controller for use with RF amplifiers in Figure 7a and b. (a) diode configuration; (b) switch configuration.
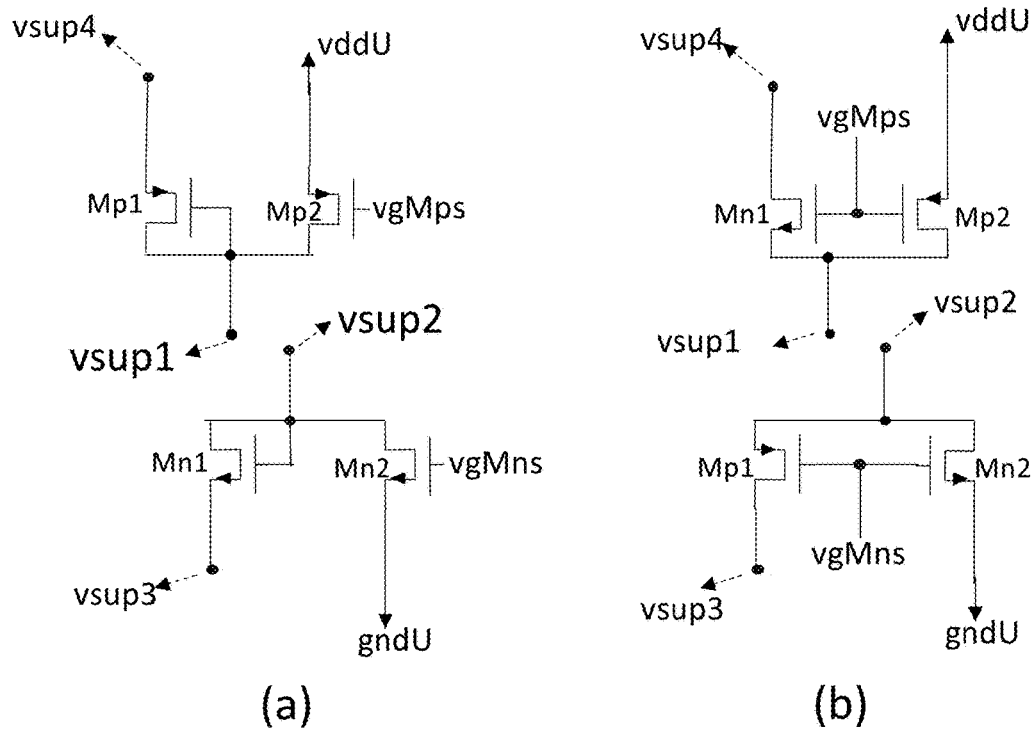
Figure 15: Embodiments of the stack/unstack controller for use with RF amplifiers in Figure 7c and d. (a) diode configuration; (b) switch configuration.

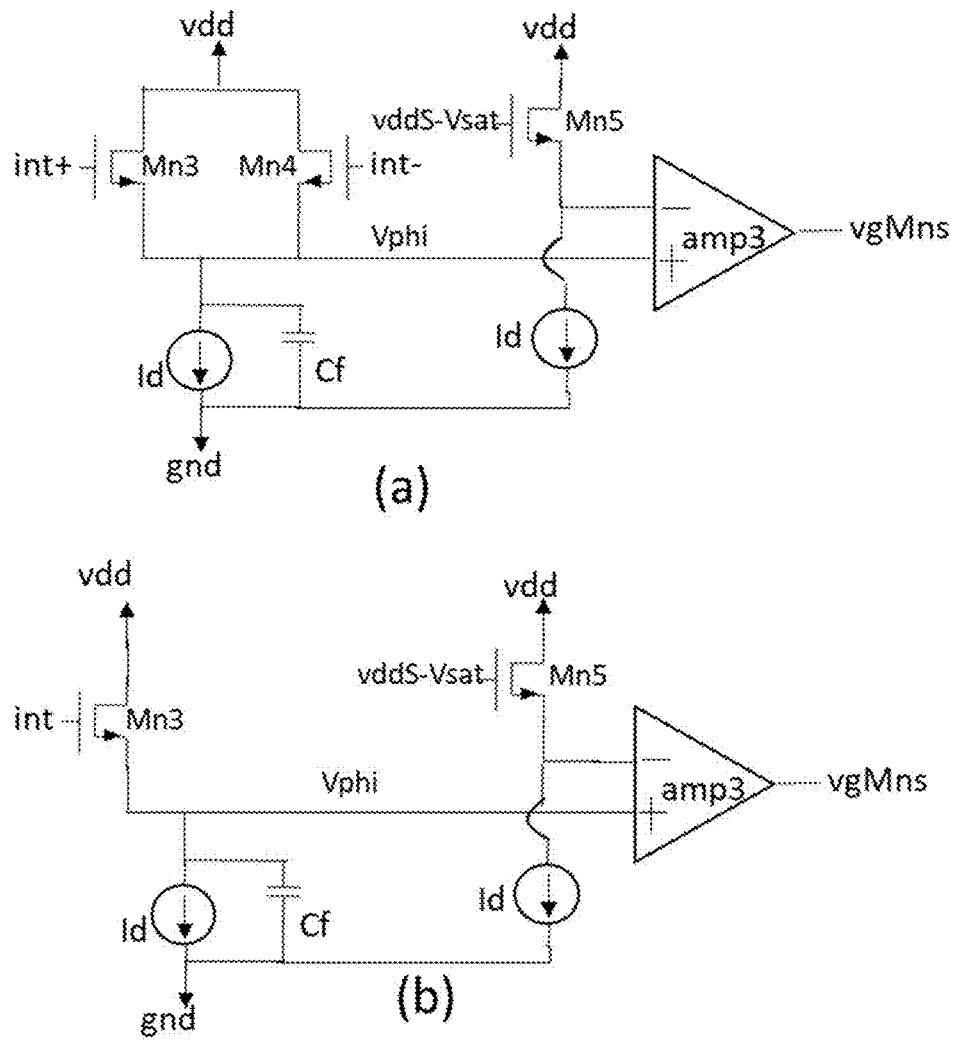
Figure 16: Preferred embodiment of the linearity detector which captures peak voltages in amp2 of Figure 1. (a) differential implementation; (b) single-ended implementation

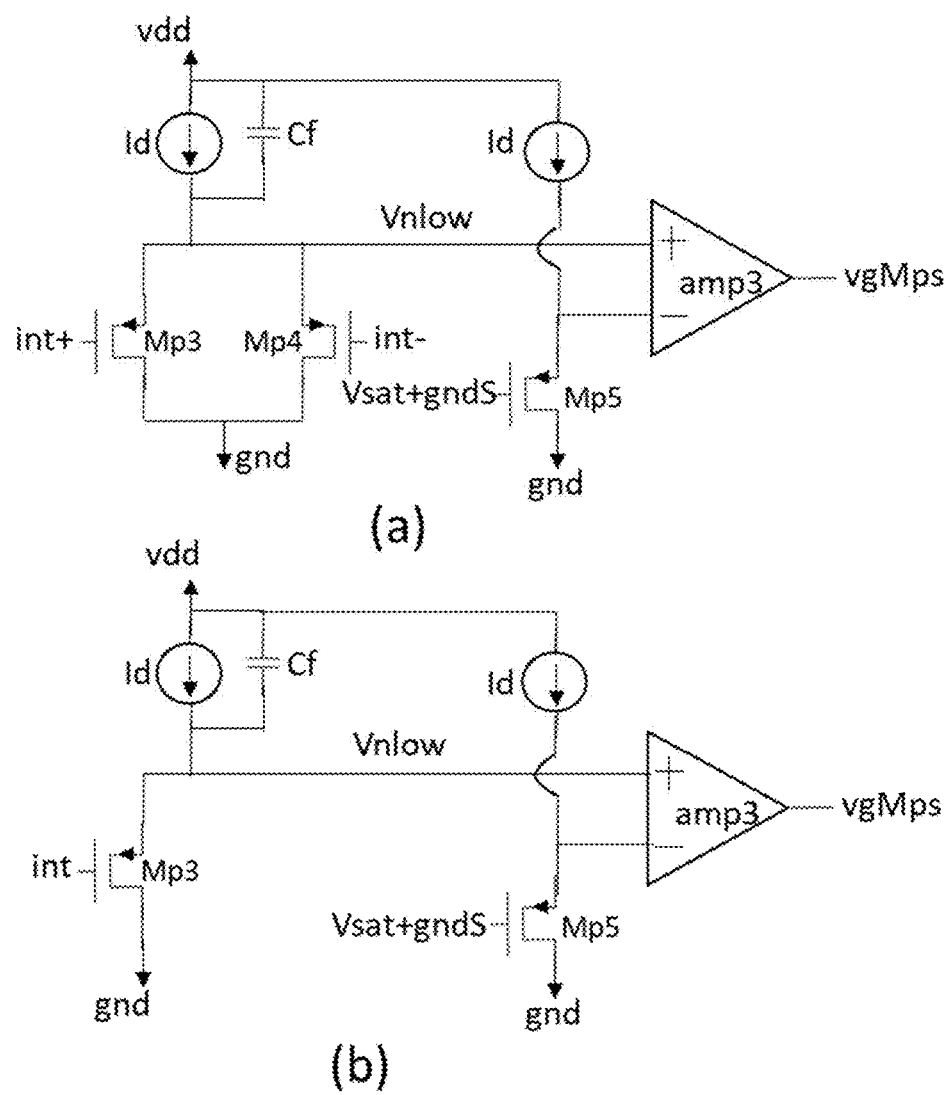
Figure 17: The embodiments of the linearity detector which captures the trough voltages in amp1 in Figure 1. (a) differential implementation; (b) single-ended implementation

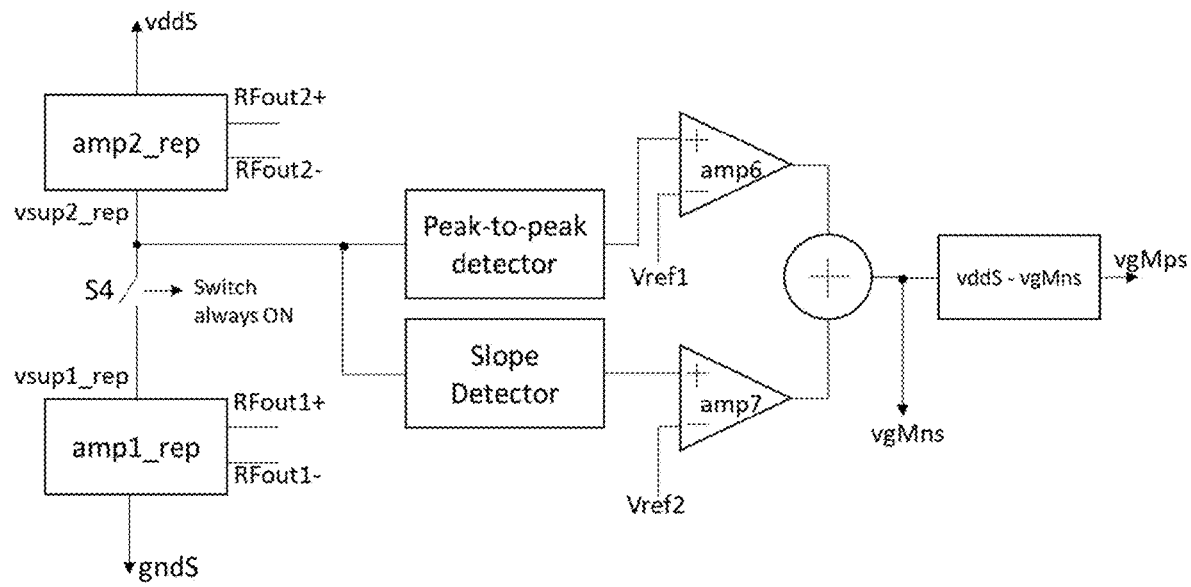
Figure 18: Embodiment of a linearity detector based on the voltage ripple and its slew rate on the supply
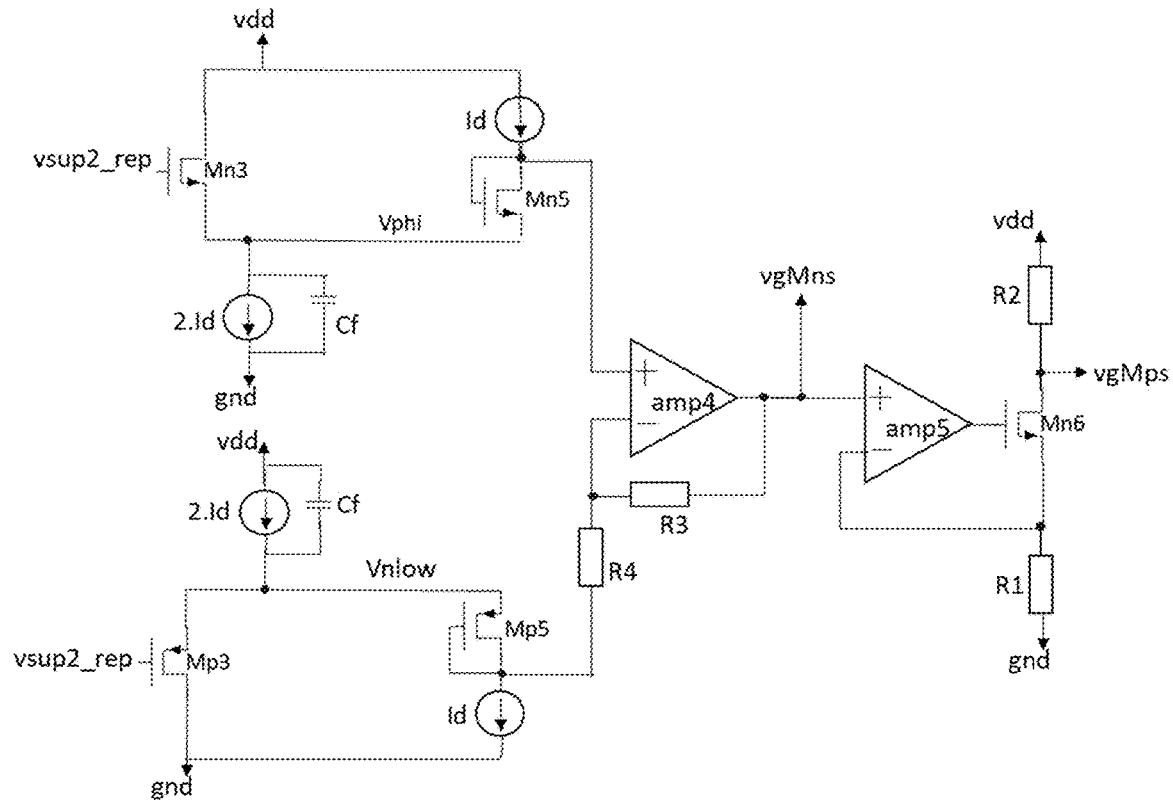
Figure 19: Embodiment of a peak-to-peak detector

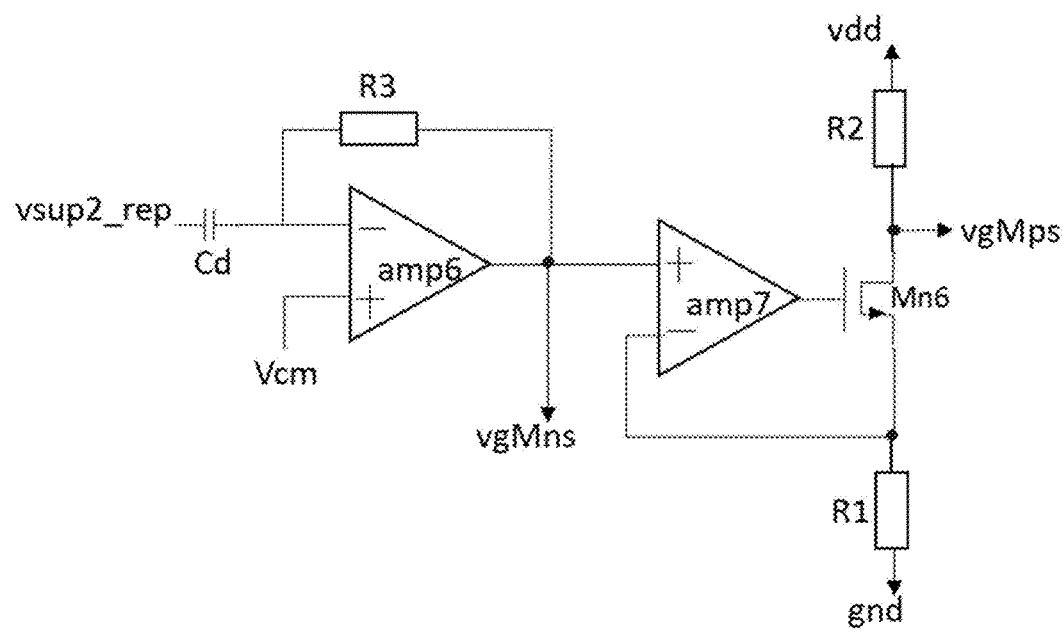
Figure 20: Embodiment of a slope detector

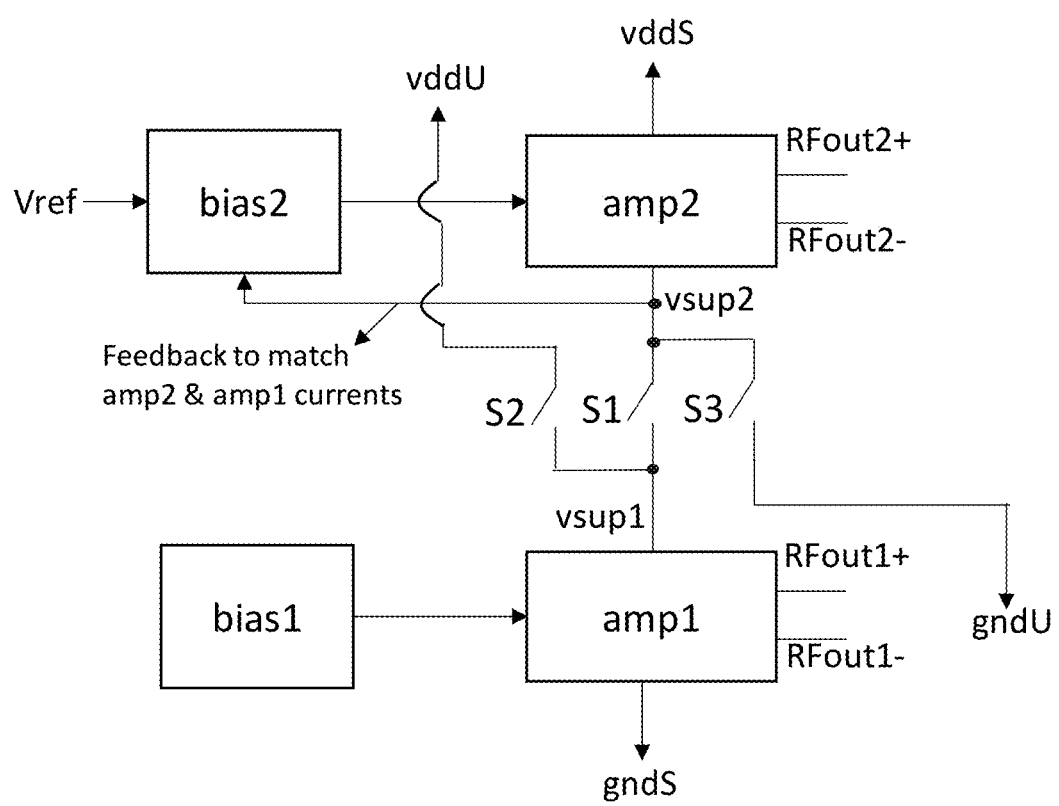
Figure 21: An embodiment of biasing to match the currents in amp1 and amp2

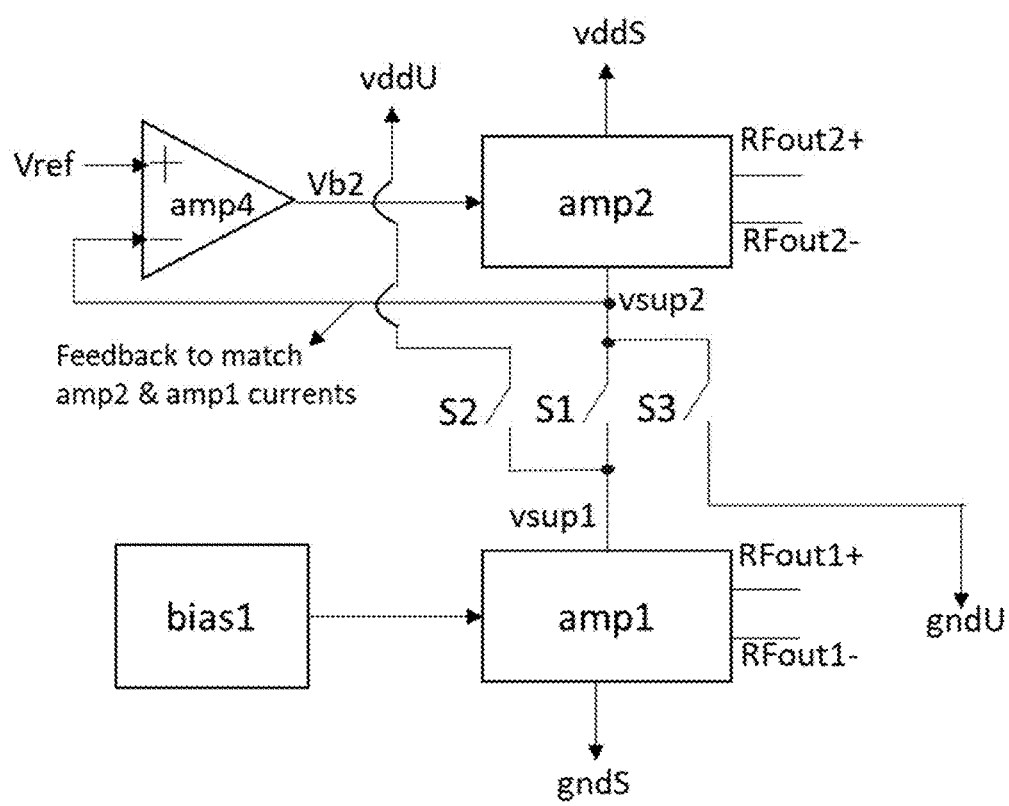
Figure 22: Embodiment of bias2 in Figure 21 using feedback

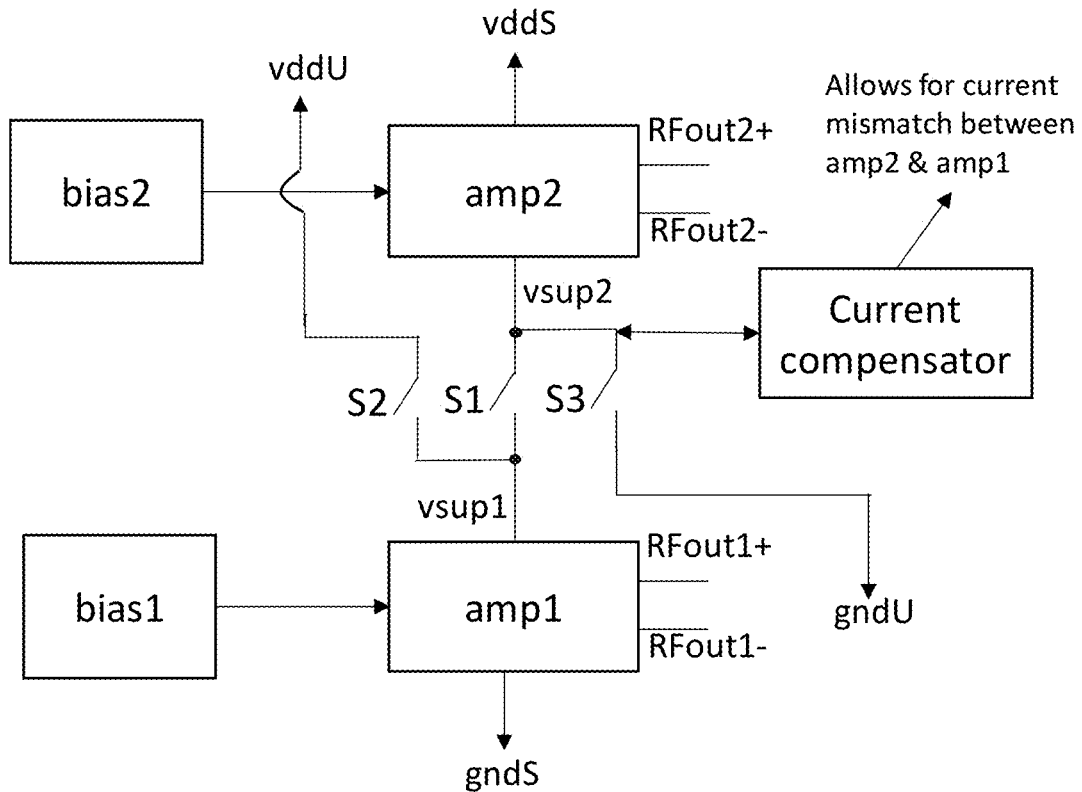
Figure 23: Embodiment of biasing to independently control the currents in amp1 and amp2
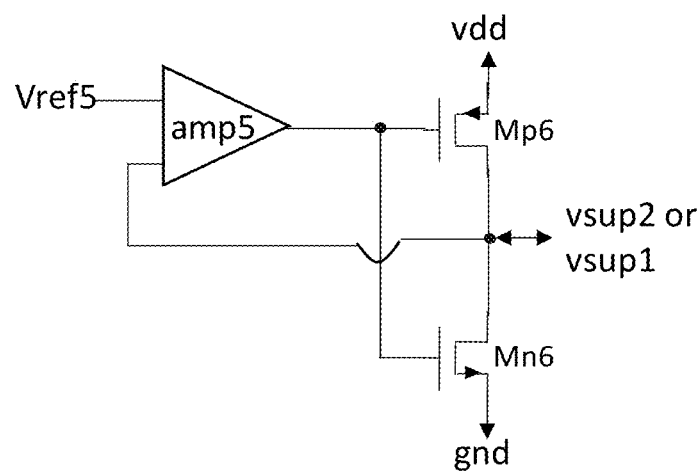
Figure 24: Embodiment of the current compensator

APPARATUS AND METHOD OF POWER MANAGEMENT USING ENVELOPE STACKING

CROSS-REFERENCE TO RELATED APPLICATION(S)

This patent application claims the benefit of U.S. Provisional Patent Application No. 62/885,638 entitled APPARATUS AND METHOD OF POWER MANAGEMENT USING ENVELOPE-STACKING filed Aug. 12, 2019, which is hereby incorporated herein by reference in its entirety.

FIELD OF THE INVENTION

The invention generally relates to power management in electronic devices and, more particularly, the invention relates to envelope stacking in electronic devices.

BACKGROUND OF THE INVENTION

The concept of Internet-of-Everything (IoE), such as smart city, has been a significant driver of the evolution of wireless communications. With ever-increasing demand for higher data rates, service carriers have improved the existing 4th-generation (4 G) networks with carrier aggregation and multi-input multi-output (MIMO) antenna techniques. To evolve beyond 4 G, the 5th-generation (5 G) networks need to be scalable, versatile, and energy-smart for the hyperconnected IoE world. By employing advanced modulation schemes, massive MIMO and beamforming, the 5 G connectivity is expected to achieve significantly enhanced data rate (10 Gbps peak data rate per user), universal coverage, spectral/spatial diversity/efficiency, and minimized latency (sub-1 ms). To reduce the heat dissipation and extend the battery life, one must maximize the power efficiency of a wireless devices, while balancing the form factor and cost competitiveness in the commercial market.

To achieve high speed data rate, spectral-efficient complex modulation schemes lead to non-constant-envelope signals with inherent high peak-to-average power ratios (PAPRs). The high PAPR signals impose stringent linearity specs for RF amplifiers in order to ensure communication quality. On the other hand, the maximum peak-to-peak voltage swing at the drain (or collector) of a RF transistor is typically around twice its DC supply voltage (VDD), assuming the RF transistor can withstand such a voltage swing. The peak drain (or collector) current is limited by the knee voltage of the RF transistor. When the input power increases, the voltage and current waveforms at the drain (or collector) of the RF transistor will start to clip, causing gain compression and thus distortions at the output of the RF amplifier.

One way for the RF amplifier to satisfy the linearity specs is to back off from its saturated power region, so that the maximum voltage swing at the drain (or collector) of the RF transistor happens only at the peak instantaneous output power level. Because the efficiency of the RF amplifier is in quadratic proportion to the voltage swing at the drain (or collector), its efficiency reduces dramatically at the back-off region, as opposed to an RF amplifier operating in its saturated power region. Since the RF amplifier often is the most power consuming block in the RF transceiver chain, its efficiency dictates the power and heat dissipation of the entire transmitter.

SUMMARY OF VARIOUS EMBODIMENTS

In accordance with an embodiment of the invention, an apparatus has a first amplifier, a second amplifier, and a switching configuration operatively coupled with the first and second amplifiers. The switching configuration is configured to dynamically switch the first and second amplifiers between a stacked and unstacked configuration as a function of an input signal.

In accordance with another embodiment of the invention, a reduced current RF power amplifier system includes a first RF amplifier for amplifying a first RF input signal and generating a first RF output signal, a second RF amplifier for amplifying a second RF input signal and generating a second RF output signal, and a stack/unstack controller including circuitry configured to switch the RF power amplifier system between a stacked mode in which said first and second RF amplifiers are coupled in a stacked configuration and an unstacked mode in which said first and second RF amplifiers are coupled in an unstacked configuration in response to one or more mode-control signals, the stacked configuration providing reduced current compared to the unstacked configuration.

Additionally, a majority of DC current of said first and second RF amplifiers is shared when in said stacked configuration, and a majority of DC current of said first and second RF amplifiers is not shared when in said unstacked configuration.

Additionally or alternatively, the stack/unstack controller may be configured to switch the first and second RF amplifiers between the stacked and unstacked configurations in a manner that maintains linearity in the first and second RF amplifiers.

Additionally or alternatively, the first RF amplifier may be coupled to a first negative power supply and may be coupled through one or more first stack-control signals to the stack/unstack controller, the second RF amplifier may be coupled to a first positive power supply and may be coupled through one or more second stack-control signals to the stack/unstack controller, and the stack/unstack controller may be coupled to a second positive power supply and to a second negative power supply, wherein the stack/unstack controller operates on said first and second stack-control signals to couple the first and second RF amplifiers in the stacked configuration between the first positive and first negative power supplies when the one or more mode-control signals indicate the stacked mode and the stack/unstack controller operates on said first and second stack-control signals from the first and second RF amplifiers to couple the first and second RF amplifiers in the unstacked configuration between the second positive and second negative power supplies when the one or more mode-control signals indicate the unstacked mode. In any such embodiments, the stack/unstack controller may include switches to move said first and second stack-control signals toward said second positive and second negative power supplies when said one or more mode-control inputs identify the unstacked mode, DC currents from said second positive power supply and into said second negative power supply may be reduced when said first and second RF amplifiers are in the stacked configuration compared to the unstacked configuration, the second negative power supply may be the same as said first negative power supply, the second positive power supply may be the same as said first positive power supply, the second negative power supply may be a virtual ground node within said first RF amplifier, and/or the second positive power supply may be a virtual ground node within said second RF amplifier.

Additionally or alternatively, the system may further include a power combiner operable to combine the powers in said first and second RF outputs into a single RF signal, such as, for example, a lumped element matching network or a transformer.

Additionally or alternatively, the first RF amplifier may include a NMOS common source amplifier, a 2-stack NMOS amplifier, or a 3-stack NMOS amplifier. Similarly, the second RF amplifier may be a PMOS common source amplifier, a 2-stack PMOS amplifier, or a 3-stack PMOS amplifier.

Additionally or alternatively, each of said one or more mode-control inputs may be a dynamic signal that varies in response to the modulation envelope of at least one of said first or second RF input signals or may be a static signal with respect to the modulation envelope.

Additionally or alternatively, the system may further include one or more RF connections between said first and second RF amplifiers, wherein said one or more RF connections provide a path for DC current to flow when in the stacked configuration.

Additionally or alternatively, the system may further include a linearity detector configured to detect if the RF power amplifier system would meet predetermined linearity performance criteria in the stacked configuration and to generate one or more linearity detector output signals, wherein the one or more mode-control signals are based on the linearity detector output signals. The linearity detector may be configured to detect if the RF outputs of said first and second RF amplifiers would meet predetermined linearity performance criteria in the stacked configuration. When it is detected that the RF power amplifier system would meet predetermined linearity performance criteria in the stacked configuration, one or more mode-control signals may be generated to indicate the stacked mode, and when it is detected that the RF power amplifier system would not meet predetermined linearity performance criteria in the stacked configuration, one or more mode-control signals may be generated to indicate the unstacked mode. The linearity detector may include one or more peak detectors operable to generate an envelope signal representative of the envelope of one or more of said first and second RF output signals or may include a slope detector.

Additionally or alternatively, the system may further include a power tracker configured to monitor a baseband system power code and to generate one or more power tracker output signals indicating whether the baseband system power code is in a predetermined low power code range or in a predetermined high power code range. In certain exemplary embodiments, the one or more mode-control signals may be based on the power tracker output signals, e.g., indicating the stacked mode when the baseband system power code is in the low power code range and indicating the unstacked mode when the baseband system power code is in the high power code range. When used in combination with a linearity detector, the system may operate such that when the one or more power tracker output signals indicate that the baseband system power code is in the predetermined low power code range, one or more mode-control signals are generated to indicate the stacked mode and the linearity detector is disabled in order to eliminate its power consumption, and when the one or more power tracker output signals indicate that the baseband system power code is in the predetermined high power code range, one or more mode-control signals are generated based on the one or more linearity detector output signals.

Additionally or alternatively, the one or more mode-control signals may be based on other criteria such as, for example, modulation type to be used for transmission or average RF power levels in a portion of a transmit chain ahead of the first and second RF power amplifiers.

Additionally or alternatively, the stack/unstack controller may include FETs to provide additional current to said first and second RF amplifiers when said one or more mode-control inputs specify an unstacked configuration and/or may include a switch or diode to provide a DC current path between said first and second RF amplifiers when said one or more mode-control inputs specify a stacked configuration. The system may further include bias circuitry to control the DC voltage of said first and second RF outputs when said first and second amplifiers are in a stacked configuration. The system may further include a current compensator to allow independent control of the bias currents in said first and second RF amplifiers when said first and second RF amplifiers are in a stacked configuration.

In accordance with another embodiment of the invention, there is provided a method of reducing the current of an RF power amplifier system having first and second RF amplifiers and a stack/unstack controller including circuitry configured to switch the RF power amplifier system between a stacked mode in which said first and second RF amplifiers are coupled in a stacked configuration and an unstacked mode in which said first and second RF amplifiers are coupled in an unstacked configuration in response to one or more mode-control signals, the stacked configuration providing reduced current compared to the unstacked configuration. The method involves receiving, by the stack/unstack controller, one or more mode-control signals, and switching, by the stack/unstack controller, the first and second RF amplifiers into the mode indicated by the mode-control signal.

In various alternative embodiment, the method may further involve detecting if the RF power amplifier system would meet predetermined linearity performance criteria in the stacked configuration and generating the one or more mode-control signals based on such linearity detection. Detecting if the RF power amplifier system would meet predetermined linearity performance criteria in the stacked configuration may involve sensing signals in at least one of the first and second RF amplifiers and determining if the RF power amplifier system would meet predetermined linearity performance criteria in the stacked configuration based on said sensed signals. Detecting if the RF power amplifier system would meet predetermined linearity performance criteria in the stacked configuration may involve detecting if the RF outputs of said first and second RF amplifiers would meet predetermined linearity performance criteria in the stacked configuration.

Additionally or alternatively, the method may further involve generating one or more mode-control signals indicating the stacked mode if the RF power amplifier system would meet predetermined linearity performance criteria in the stacked configuration and generating one or more mode-control signals indicating the unstacked mode if the RF power amplifier system would not meet predetermined linearity performance criteria in the stacked configuration. The method may further involve monitoring a baseband system power code and generating the one or more mode-control signals as a function of such monitoring. For example, when the baseband system power code is in a predetermined low power code range, one or more mode-control signals may be generated to indicate the stacked mode, and when the one or more power tracker output signals indicate that the baseband system power code is in a predetermined high power code range, one or more mode-control signals may be generated to indicate the unstacked mode, or when the baseband system power code is in a predetermined low power code range, one or more mode-control signals may be generated to indicate the stacked mode and a linearity detector may be disabled in order to eliminate its power consumption, and when the one or more power tracker output signals indicate that the baseband system power code is in a predetermined high power code range, one or more mode-control signals may be generated based on the linearity detector. Each of said one or more mode-control inputs may be a dynamic signal that varies in response to the modulation envelope of at least one of said first or second RF input signals or may be a static signal with respect to the modulation envelope. The method may further involve generating one or more mode-control signals based on a modulation type to be used for transmission in order to indicate a stack/unstack mode associated with the modulation type. The method may further involve generating one or more mode-control signals based on average RF power levels in a portion of a transmit chain ahead of the first and second RF power amplifiers.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 1 schematically shows a block diagram of an envelope stacking system in illustrative embodiments of the invention.

FIG. 2 schematically shows a behavioral model of stack/unstack controller when stacked (a) and when unstacked (b) in illustrative embodiments.

FIG. 3 graphically shows efficiency characteristics of stacked, unstacked, and envelope stacking RF amplifiers (a) for a CW waveform and (b) for a modulated waveform in illustrative embodiments.

FIG. 4 schematically shows a block diagram of a second preferred embodiment of an envelope stacking system with externally provided mode control.

FIG. 5 graphically shows CCDF for a CP-OFDM signal with 256-QAM in illustrative embodiments.

FIG. 6 schematically shows various examples of single-ended amplifier circuits for first and second amplifiers in illustrative embodiments.

FIG. 7 schematically shows various examples of differential amplifier circuits for first and second amplifiers in illustrative embodiments.

FIG. 8 schematically shows an embodiment of power combining for single-ended RF amplifiers using a Wilkinson combiner.

FIG. 9 schematically shows an embodiment of power combining for single-ended RF amplifiers using lumped elements.

FIG. 10 schematically shows an embodiment of power combining for differential RF amplifier using a parallel-combining transformer.

FIG. 11 schematically shows an embodiment of power combining for differential RF amplifiers using a series-combining transformer.

FIG. 12 schematically shows a preferred embodiment of a stack/unstack controller: (a) switch configuration; (b) diode configuration.

FIG. 13 graphically shows the impact of diode drop on envelope stacking efficiency vs. power in illustrative embodiments.

FIG. 14 schematically shows various embodiments of the stack/unstack controller for use with RF amplifiers in FIGS. 7a and b: (a) diode configuration; (b) switch configuration.

FIG. 15 schematically shows various embodiments of the stack/unstack controller for use with RF amplifiers in FIGS. 7c and d: (a) diode configuration; (b) switch configuration.

FIG. 16 schematically shows a preferred embodiment of the linearity detector which captures peak voltages in amp2 of FIG. 1: (a) differential implementation; (b) single-ended implementation.

FIG. 17 schematically shows illustrative embodiments of the linearity detector which captures the trough voltages in amp1 in FIG. 1: (a) differential implementation; (b) single-ended implementation FIG. 18 schematically shows an embodiment of a linearity detector based on the voltage ripple and its slew rate on the supply.

FIG. 19 schematically shows an embodiment of a peak-to-peak detector.

FIG. 20 schematically shows an embodiment of a slope detector.

FIG. 21 schematically shows an embodiment of biasing to match the currents in amp1 and amp2.

FIG. 22 schematically shows an embodiment of bias2 in FIG. 21 using feedback.

FIG. 23 schematically shows an embodiment of biasing to independently control the currents in amp1 and amp2.

FIG. 24 schematically shows an embodiment of the current compensator.

DESCRIPTION OF ILLUSTRATIVE EMBODIMENTS

In illustrative embodiments, an envelope stacking power amplifier system reduces current for a given output power level without sacrificing the ability to support large voltage swings at saturation and therefore increases efficiency at the maximum linear operating power and all power levels below that. A block diagram of one embodiment of the present invention is shown in FIG. 1. It includes two RF power amplifiers, amp1 and amp2, that amplify two incoming RF signals, Rfin1 and RFin2, a linearity detector that monitors whether amp1 or amp2 would operate linearly if in a stacked state, a stack/unstack controller that configures amp1 and amp2 in either a stacked or an unstacked state depending on the conclusion of the linearity detector and that moves the system between the stacked and unstacked states, and optionally a power combiner that combines the power from the two RF power amplifier outputs, RFout1 and RFout2, into a single amplified output, RFout3.

Each of the RF inputs to the envelope stacking system of FIG. 1, RFin1 and Rfin2, can be comprised of one single-ended signal, a differential signal pair, multiple single-ended signals, multiple differential signal pairs, or some other suitable signal combination. Similarly, each of the amplified outputs, RFout1 and RFout2, can be comprised of one single-ended signal, a differential signal pair, multiple single-ended signals, multiple differential signal pairs, or some other suitable signal combination. The configuration of the RF input signals does not need to be the same as that of the RF output signals so for example, RFin1 could be differential while RFout1 is single-ended. Signals RFin1 and Rfin2 could contain any type of modulation or they could be CW signals with no modulation at all. RFin1 and RFin2 do not need to have the same waveform.

RF amplifier amp1 has a negative power supply of gndS and a positive power supply of vsup1, which is a first stack-control signal controlled by the stack/unstack controller and that may move in response to the envelope of the RF signal or in response to the peak of the envelope at each average power level. RF amplifier amp2 has a positive power supply of vddS and a negative power supply of vsup2, which is a second stack-control signal that may move in response to the RF signal envelope or in response to the peak of the envelope at each average power level under control by the stack/unstack controller.

In the embodiment of FIG. 1 the RF outputs from amp1 and amp2, RFout1 and RFout2, are combined in a power combiner to generate a single output, RFout3. The power combining function can be implemented using techniques that are well known to those skilled in the field. Examples of suitable combiner circuits include a balun, a transformer, a lumped element combiner, or a Wilkinson combiner. Not all embodiments of the envelope stacking system include a power combiner as there are numerous ways to utilize the power from 2 separate RF outputs. For example, the power from RFout1 and RFout2 could be fed to two separate antennas and combined in the air, meaning there would be no circuitry associated with the combining. As another example where the power might not be combined at all, RFout1 might represent a horizontal polarization signal and Rfout2 might represent a vertical polarization signal. In this example it is desirable to utilize these two power outputs separately and there is no need for power combining.

The linearity detector takes as inputs one or more signals from either the output of amp1 or from within amp1 and from either the output of amp2 or from within amp2 indicating whether these amplifiers are currently operating linearly and/or whether they would operate linearly if in a stacked state. Saturation is the most common source of nonlinearity that it would detect but there are many ways in which an amplifier can deviate from linear operation and consequently there are many possible linearity metrics that the linearity detector block could evaluate.

In many cases, an envelope stacking system evaluates linearity metrics that can be changed by moving between stacked and unstacked states. One example of such a linearity metric is saturation. As the power level within the amplifier increases and its internal voltage swings increase, the amplifier will eventually run out of available voltage range and its output power will clip. This is referred to herein as saturation. Saturation might occur in a stacked state but be alleviated in an unstacked state. An envelope stacking system can detect or predict the potential onset of saturation that would occur in the stacked state by looking at voltage swings or power levels within amp1 and amp2 and it can then instruct the system to unstack or to remain unstacked if already unstacked so as to alleviate the nonlinear operation before it occurs.

A second example of a linearity metric that the linearity detector could detect is slew rate on the supply. At low signal bandwidths the envelope stacking system can track the envelope of the signal with sufficiently low delay so as to maintain linearity. However, at high signal bandwidths the stack/unstack controller may not be able to keep up with the rapidly moving envelope and the resulting delay on the supply may cause nonlinearity. The linearity detector could detect such a condition and instruct the stack/unstack controller to remain unstacked for its duration so as to avoid the resulting nonlinearity.

The linearity detector sends a signal to the stack/unstack controller to tell it whether amp1 and amp2 should be stacked or unstacked or transitioning between those states. The goal of the linearity detector's algorithm is to keep amplifiers amp1 and amp2 operating linearly as much as possible. Many possible algorithms exist for performing that function. One simple option is an OR operation. If neither amp1 nor amp2 is at risk of being saturated when stacked, the amplifiers amp1 and amp2 would be configured as stacked. If either amp1 or amp2 would be saturated when stacked, the amplifiers amp1 and amp2 would be configured as unstacked. If either amp1 or amp2 is approaching saturation when stacked, then the system would be configured to transition between the stacked and unstacked states so as to mitigate the impending saturation.

Behavioral representations of the stacked and unstacked states are shown in FIG. 2. In the stacked state in (a), a current path is provided between vsup1 and vsup2 so that the current of amp1 also flows through and is shared with amp2. Resistor R1 may be implemented using a switch device, which could be built from any suitable switch technology including but not limited to CMOS, bipolar, GaAs HBT, and FINFET, and in this embodiment it would generally be desired for the resistance R1 to be as small as possible when the amplifier has completed the transition between states. In another embodiment, resistor R1 may be implemented using a diode or a diode connected transistor, in which case there is voltage drop across R1. In the unstacked state in (b), a current path is provided between vsup1 and the unstacked supply vddU and between vsup2 and the unstacked supply gndU, thereby increasing the supply voltage available to amplifiers amp1 and amp2 and increasing the voltage levels at which these amplifiers saturate. Supply vddU might be the same supply as vddS but in general does not need to be. Supply gndU might be the same supply as gndS but in general does not need to be. Resistors R2 and R3 may be implemented using switch devices, which could be built from any suitable switch technology and generally it is preferred for the resistances R2 and R3 to be as small as possible once the system has completed transition to the stacked state.

The stack/unstack controller manages the transition between the stacked state in (a) and the unstacked state in (b). In a relatively simple embodiment, there is just a transition between two digital states. If the transition is done in response to the signal modulation, sufficient smoothing must be applied to keep the signals from both RF amplifiers linear during the transition and to avoid spectral artifacts. In other embodiments, there may be a continuous and gradual transition between stacked and unstacked states with intermediate states of partial current sharing. In another embodiment, the stack/unstack controller might move vsup1 and vsup2 up or down to provide more voltage headroom to whichever amplifier is closer to saturation by subtracting that headroom from the other amplifier. This approach could be utilized to increase the percentage of time that the system spends stacked, compared to the OR algorithm described above, when the voltages in amp1 and amp2 deviate from one another, for example, due to amplifier process skews.

The envelope stacking invention operates to reduce the average current consumed by the amplifier system by keeping amp1 and amp2 stacked some or most of the time so that the average current of the system is reduced. This is illustrated with respect to FIG. 3, which shows efficiency vs output power of the amplifier system for both CW and modulated waveforms. If amp1 and amp2 are hardwired in an unstacked configuration then their CW efficiency vs. output power follows the unstacked curve in (a). If amp1 and amp2 are hardwired in a stacked configuration then their CW efficiency vs. output power follows the stacked curve. The power at which the amplifiers saturate when stacked is much lower than that when unstacked, and in the simplest configuration where equal voltages are allocated to amp1 and amp2 that difference is 6 dB. At low power levels the current consumed by a system on the stacked curve is half that consumed by a system on the unstacked curve and as such the efficiency for the stacked case is twice that of unstacked. An envelope stacking system will operate on the envelope stacking curve in (a), which follows the stacked curve for power levels less than the saturated power of the stacked state and follows the unstacked curve for power levels greater than the saturated power of the stacked state and which has a region of transition between these states.

The efficiency of illustrative embodiments of envelope stacking with modulated signals is shown in FIG. 3b. A modulated waveform spends time at a range of instantaneous power levels and the size of that range depends on the PAPR of the waveform, which causes the sharp transition in (a) to become smoothed out in (b). At small signals for a modulated waveform the efficiency remains twice that of the unstacked case. At large signals, near saturation, the efficiency is similar to that of the unstacked case. In between these extremes the degree of smoothing depends on the PAPR of the modulated waveform.

RF amplifiers for linear modulation operate only up to a certain average power level at which the system remains linear. For example, for a typical 5 G waveform with a peak-to-average ratio of about 10 dB, the maximum linear operating power of an amplifier will typically be 6-8 dB below the amplifier's saturated power. The design of the envelope stacking system preferably engineers this efficiency response to achieve the optimum efficiency improvement at or close to the point of maximum linear operating power. There is no need to improve efficiency for average power levels above the maximum linear operating power. This is illustrated in FIG. 3b, where the maximum linear operating power is indicated by a dashed line and efficiency is improved for all power levels below that level.

Some embodiments extend the envelope stacking approach to a stack of more than two amplifiers. For example, two systems such as that shown in FIG. 1 could be stacked on top of one another in a stack of four amplifiers. These four amplifiers could be dynamically stacked and unstacked, according to the various envelope stacking embodiments, in any combination. Some combinations of amplifiers could also remain permanently stacked while others dynamically stack and unstack.

Another embodiment of the envelope stacking system, shown in FIG. 4, is similar to that in FIG. 1 except that the mode-control signal, which selects between stacked and unstacked modes, is an externally-generated signal and is provided as an input to the envelope stacking system. One example where such an embodiment could be used is in an average power tracking usage, whereby stacked or unstacked configurations are selected based on the baseband system's power code. In another example, the mode-control signal could select stacked or unstacked operation depending on the modulation type to be used for transmission, for example QPSK versus 64QAM. In another case, average RF power levels earlier in the transmit chain could be observed and used to select stacked or unstacked operation. The prior examples are cases where the mode-control signal is a digital input that doesn't change with the signal modulation. Alternatively, the mode-control signal could originate from a digital system and could be provided as an analog input to the stack/unstack controller via a digital-to-analog converter using information from the baseband that tracks the envelope. A linearity detector might be present within the envelope stacking system to provide information about impending saturation to external circuits that generate the mode control signal.

Some embodiments may combine the embodiments of FIG. 4 and FIG. 1 so that sometimes the system is utilized as in FIG. 1 and other times it is utilized as in FIG. 4. For example, in average power tracking applications, at high power codes, the closed-loop system of FIG. 1 could be used, whereas at low power codes, the open-loop system of FIG. 4 could be used to hardwire amp1 and amp2 into a stacked state, meanwhile disabling the linearity detector to eliminate its power consumption.

An example of the statistics of a high peak-to-average ratio waveform are shown in FIG. 5. An x-axis value of zero represents the average power in the waveform and means that if the saturation power of the stacked state in FIG. 3a is positioned right at the point of maximum linear operating power then approximately 50% of the time will be spent stacked and 50% will be spent unstacked. If the transition between stacked and unstacked states can be moved 2 dB higher in power then the system will spend 80% of its time stacked and only 20% of its time unstacked, which will yield a better efficiency result. Illustrative embodiments thus preferably move the stack/unstack transition to the highest possible power level while still avoiding saturation within the stacked state.

Any one of a number of RF amplifier techniques that are well known to those skilled in the field are suitable for use in RF amplifiers amp1 and amp2 in FIG. 1. Some possible implementations are shown in FIG. 6. The amplifier in (a) is a common-source NMOS-based RF amplifier with NMOS cascode that is commonly used in the field and would work well for amp1, which is ground referenced. The amplifier in (b) is a common-source PMOS-based RF amplifier with PMOS cascode and would work well for amp2, which is referenced to a positive supply. The amplifier in (c) is an NMOS common-source amplifier that is ground referenced, which would make it suitable for amp1 and that in (d) is a PMOS common-source amplifier that would be well suited for amp2. Although NMOS-based amplifiers are generally better suited for ground-referenced amplifiers and PMOS-based amplifiers are generally better suited for Vdd-based amplifiers, it is possible to utilize an NMOS-based amplifier such as those in (a) or (c) for amp2, and it is possible to utilize a PMOS-based amplifier such as those in (b) or (d) for amp1.

Some examples of possible differential RF amplifier implementations for amp1 and amp2 from FIG. 1 are shown in FIG. 7. The amplifier in (a) is a differential NMOS common-source amplifier with NMOS cascode that is widely used in the field. It is well suited for amp1 due to its ground reference, but it could be used in an alternate stacking style for amp2 as well. The amplifier in (b) is a differential PMOS common-source amplifier with PMOS cascode similar to that in (a) but is referenced to a positive supply and therefore works well for amp2, but it could also be used in an alternate stacking style for amp1 if desired.

The amplifier in (c) is similar to that in (a) but with the additional DC path provided by L1 and L2, which create a virtual-supply point vsup3 that can be utilized by the stack/unstack controller. The amplifier in (d) is similar to that in (b) but with the additional DC path provided by L1 and L2, creating virtual-supply point vsup4 for use by the stack/unstack controller. It is understood that the abovementioned examples of amp1 and amp2 implementations are not exhaustive. Many other RF amplifier topologies would be suitable, and an assortment of device technologies could be used within, including but not limited to GaAs HBT, Silicon bipolar, and FINFET.

The following description provides more details on possible implementations for the power combiner block in FIG. 1. FIG. 8 shows the Wilkinson power combiner implemented by quarter-wavelength transmission lines. It can be used with the single-ended RF amplifiers such as the ones shown in FIG. 6. At lower frequencies, the Wilkinson power combiner can be implemented by the lumped elements (L, C) as shown in FIG. 9.

For differential RF amplifiers such as the ones in FIG. 7, the power combining can also be realized by transformers. FIG. 10 shows the power combining for differential RF amplifiers using a parallel-combining transformer (PCT) that combines currents in parallel. The number of turns of primary windings and secondary windings are denoted as N1 and N2, respectively. The secondary winding is shared by multiple primary windings and sums all AC currents induced by each primary winding. FIG. 11 shows the power combining for differential RF amplifiers using a series-combining transformer (SCT) that aggregates voltages. The number of turns of primary windings and secondary windings are denoted as N1 and N2, respectively. Multiple secondary windings are connected in series, each of which is correspondingly coupled to individual primary windings. AC voltages across each secondary winding are summed at the top of the secondary node. In FIG. 10 and FIG. 11, the output RFout3 of the secondary winding is single-ended with the other node connected to the ground reference. Additionally, both nodes of the secondary winding can be used to form a differential output RFout3.

The following description provides more details on the implementation of the stack/unstack controller shown in FIG. 1. FIG. 12 shows preferred embodiments of this block. The figures show that the amplifier outputs are differential, but this is not essential for the operation of the controller. In (a) three switches S1, S2 and S3 are used to switch the amplifiers amp1 and amp2 between the stacked and unstacked configurations. These switches can be made from any suitable semiconductor device technology. The stacked configuration is referred to herein as the condition where S1 is ON (closed) and both S2 and S3 are OFF (open) and the RF amplifiers amp1 and amp2 share their DC current between the vddS and gndS supplies. An unstacked configuration is referred to herein as the condition when S1 is OFF but both S2 and S3 are ON so that current is not shared between the two RF amplifiers and instead flows separately to the vddU and gndU supplies. S2 provides the path for amp1 current to flow to supply vddU, and S3 provides the path for amp2 current to flow to supply gndU. The supplies vddU and vddS might be the same or might be different. As one example of why they might be chosen as different, having vddS higher than vddU may be helpful for raising the power level of the transition between stacked and unstacked. Similarly, the supplies gndU and gndS might be the same or might be different.

The switches S1, S2 and S3 can all be ON at the same time, in which case depending on the strength of the switches, which is decided by their control voltages, the RF amplifiers can be in the transition state between stacked and unstacked configurations, with part of the current being shared and part of it unshared. One important consideration is to ensure that switch S1 does not conduct in the reverse direction. The reverse conduction of S1 causes shoot-through current and results in loss of efficiency. In most embodiments it is desired that the ON resistance of the switches be low, and their OFF resistance be high for high-efficiency operation.

The configuration of FIG. 12a, wherein current in the stacked mode flows through a switch, is referred to herein as the switch embodiment. A disadvantage is the abovementioned shoot-through current. FIG. 12b shows an embodiment, referred to herein as the diode embodiment that ensures that S1 does not conduct in the reverse direction. Diode D1 in (b) replaces switch S1 in (a) and since diodes do not conduct in reverse direction this helps prevent shoot-through current. However, the diode comes with a drawback of voltage drop across it when it conducts, which reduces headroom available to the amplifiers and reduces saturation power in the stacked state. This is illustrated in FIG. 13, which shows that the maximum stacked power that is achievable on the blue curve of the switch embodiment is reduced on the green curve of the diode embodiment. The strengths of S2 and S3 will decide how much current is shared between the two RF amplifiers. Diode D1 can be a P-N junction diode, a MOS transistor in a diode connected configuration, or any suitable rectifying element.

FIG. 14 shows a preferred embodiment of the stack/unstack controller for use with the RF amplifiers shown in FIGS. 7a and b. The nodes vsup1 and vsup2 in the controller of FIG. 14 connect to the equivalently labelled nodes vsup1 and vsup2 in the RF amplifiers of FIGS. 7a and b. MOS transistors are shown in FIG. 14, but it is understood that these elements could be built from any suitable semiconductor technology and that the polarity of these devices could be changed as long the polarity of the corresponding control signal is changed accordingly.

In the diode embodiment of FIG. 14a, NMOS transistor Mn1 implements diode D1 in FIG. 12b, while PMOS transistor Mp2 and NMOS transistor Mn2 implement the switches S2 and S3, respectively. A switch embodiment in FIG. 14b uses MOS transistors Mn1 and Mp1 in parallel to implement switch S1 from FIG. 12a. The switch embodiment of FIG. 14b yields better performance than the diode embodiment of (a) but requires additional complexity to prevent the conduction of Mn1 and Mp1 in the reverse direction. The arrangement in (b) utilizes the same control signals for Mn1 and Mp2 and for Mp1 and Mn2. The control signals for these devices do not need to be identical but rather could come as separate signals designed to precisely control how currents divide between the stacked and unstacked paths.

In FIG. 14b, if vsup1 goes higher than vsup2 while Mn1 and Mp1 are still conducting, it will cause shoot-through current from vddU to gndU. To prevent the shoot through, a comparator can be used to monitor the voltages at vsup1 and vsup2. When the voltage at vsup1 exceeds that at vsup2, the comparator output changes its state and turns off the transistors Mn1 and Mp1. The comparator needs to respond at the envelope frequencies.

FIG. 15 shows embodiments of the stack/unstack controller for use with the RF amplifiers of FIGS. 7c and d. The nodes vsup1, vsup2, vsup3 and vsup4 in the controller of FIG. 15 connect to the correspondingly labeled nodes in the RF amplifiers of FIGS. 7c and d. FIG. 15a is a diode embodiment, with Mp1 and Mn1 implementing the diodes and transistors Mp2 and Mn2 implementing the unstack switches. A switch embodiment in FIG. 15b has Mn1 and Mp1 implement the stacked current path and nodes vsup1, vsup2, vsup3, and vsup4 connect to the correspondingly labeled nodes in the RF amplifiers of FIGS. 7c and d.

In FIG. 15b, the complex configuration of switches makes the reverse conduction less possible, since any shoot-through current would have to flow through the cascode transistor of the RF amplifier in FIGS. 7c and d and as that current increases, vsup3 node goes lower creating an inherent negative feedback. Also, vsup3 node voltage is decided by the cascode bias and cannot go higher as opposed to in the more simple implementation in FIG. 14b where vsup1 and vsup2 are pulled to the supply and there is no limiting factor for shoot-through current.

Switching between the stacked and unstacked configurations and the transition between the two modes are performed by the stack/unstack controller, which is in turn controlled by the linearity detector. The linearity detector monitors conditions within amp1 and amp2 to make the determination of whether stacked or unstacked mode is preferred. Stacked mode is generally preferred as long as amp1 and amp2 can operate linearly when stacked. If the linearity detector determines that these RF amplifiers cannot operate linearly when stacked, then it will request that they become unstacked. The linearity detector might have separate circuits for detecting linearity of amp1 and for detecting linearity of amp2. Or alternatively, those functions might exist in a single circuit.

FIG. 16 and FIG. 17 show preferred embodiments of a linearity detector, whose metric is based on power saturation. The linearity detectors in FIG. 16a and FIG. 17a sense the RF voltages at the internal nodes int+ and int− of the differential RF amplifiers shown in FIG. 7, while those of FIG. 16b and FIG. 17b sense the RF voltages at the internal node int of the single-ended RF amplifiers shown in FIG. 6. Those in FIG. 16 generate current, which charges capacitor Cf, when the peak voltages on int+ and int− or int exceed Vphi+vth, where vth is the threshold voltage of devices Mn3 and Mn4, in a positive direction. Those in FIG. 17 generate current, which charges capacitor Cf, when the peak voltages on int+ and int− or int exceed Vnlow−vth, where vth is the threshold voltage of devices Mp3 and Mp4, in a negative direction, making this a negative trough detector of the RF signal's envelope. Meanwhile a reference current is generated by Mn5 and Mp5, using incoming reference voltages vddS−Vsat and Vsat+gndS. The captured peak or trough voltage at the envelope frequencies, on Vnlow and Vphi, is compared by baseband amplifier amp3 to the associated reference to determine whether the power saturation condition is reached and to generate signals vgMns or vgMps indicative of the result. The output of the linearity detector vgMns or vgMps is connected to the equivalently labelled switch control voltage, vgMns or vgMps, in the stack/unstack controller shown in FIG. 14 and FIG. 15.

In this way, the peak detectors of FIG. 16 compare when the incoming signals int+, int−, or int have RF peaks that exceed vddS−Vsat in the positive direction, making them positive peak detectors of the RF signal's envelope. The version in FIG. 16a can be used as a linearity detector for any type of vdd-referenced differential RF amplifiers such as the ones shown in FIGS. 7b and d. When using a differential amplifier, some embodiments do not observe both int+ and int− by the linearity detector, as these nodes may contain equivalent information and observation of one or the other may be sufficient. The version in FIG. 16b is a single-ended implementation and can be used as a linearity detector for any type of vdd-referenced single-ended RF amplifiers such as the ones shown in FIGS. 6b and d.

Another embodiment of the peak and trough detectors of FIG. 16 and FIG. 17 is configured similarly but utilizes as inputs the signals RFout1+/− and RFout2+/− shown in FIG. 7 or signals RFout1 and RFout2 shown in FIG. 6.

Other possibilities exist for performing the function of detecting power saturation, including many types of peak and trough detectors and rms detectors that are well known to those skilled in the field. Although the examples included herein show peak detection using RF voltages, saturation could potentially be detected by observing RF currents or even rectified envelope currents within the amplifier stage as well.

Similarly, the trough detectors of FIG. 17 compare when the incoming signals int+, int−, or int have RF peaks that exceed Vsat+gndS in the negative direction, making them negative trough detectors of the RF signal's envelope. FIG. 17a is a differential trough detector which senses the RF voltages at the nodes int+ and int− with the transistors Mp3, Mp4 and determines whether the trough voltage at the envelope frequencies drop below Vsat+gndS. It can be used as a linearity detector for any type of gnd-referenced differential RF amplifiers such as the ones shown in FIGS. 7a and c. FIG. 17b is a single-ended implementation of the trough detector, which senses the RF voltage at the node int with the transistors Mp3 and determines whether the trough voltage at the envelope frequencies drop below Vsat+gndS. It can be used as a linearity detector for any type of gnd-referenced singled-ended RF amplifiers such as the ones shown in FIGS. 6a and c. For differential RF amplifiers, the single-ended trough detector in FIG. 17b can also be used by sensing either node int+or node int−. In both FIGS. 17a and 17b, the trough voltage at the envelope frequencies is captured at the node Vnlow on the capacitor Cf. Vnlow is compared to the reference voltage generated by Mp5 and is amplified by the baseband amplifier amp3 to generate vgMps. As the switch control voltage for the stack/unstack controller, the output of the linearity detector vgMps is connected to the equivalently labelled node vgMps in the stack/unstack controller shown in FIGS. 14 and 15.

In the embodiments shown in FIG. 16 and FIG. 17, the supply vdd can be the same or independent of the supplies vddU and vddS in FIG. 1. Similarly, the ground gnd can be the same or different than ground nodes gndU and gndS shown in FIG. 1. However, in most cases the reference voltages vddS−Vsat and Vsat+gndS would be referred to the supply vddS and ground gndS of amp1 and amp2 shown in FIG. 1.

Preferably illustrative embodiments have two requirements for the linearity detector and stack/unstack controller. First, to prevent the RF amplifiers (amp1 and amp2 in FIG. 1) from entering saturation, the controller dynamically adjusts the switch control voltages according to the instantaneous power level by monitoring the RF amplifiers' state—whether they would saturate if stacked and how much current sharing they can tolerate while still staying in the linear operating region. Secondly, the linearity detector and stack/unstack controller have a fast response. The time taken to detect the linear state and adjust the switch control voltages is the response time of the linearity detector and stack/unstack controller. If the response time is too slow, the timing mismatch between the RF input signal and the supply voltage waveform will degrade linearity of these amplifiers, which is problematic for systems requiring linear modulation.

The voltages vddS−Vsat and Vsat+gndS used in the embodiments of the linearity detector shown in FIG. 16 and FIG. 17 are the reference voltages which represents the saturation state of a RF amplifier. The value of Vsat should be optimized based on the trade-off between efficiency and linearity. If a large Vsat is set, the RF amplifiers will spend more time in the unstacked configuration reducing the overall efficiency, but this prevents the RF amplifiers from entering the saturation region and reduces the RF amplifiers' sensitivity to the response time of the linearity detector and stack/unstack controller.

Besides detecting the power saturation of amp1 and amp2, the linearity detector can be implemented by monitoring one or more other linearity metrics that might cause unacceptable distortion in a modulated waveform. As an example, FIG. 18 shows an embodiment of such a linearity detector, which examines the voltage ripple and slew rate of the supply. Amp1_rep and amp2_rep are the respective replicas of amp1 and amp2 in FIG. 1 that always stay in the stacked configuration. A peak-to-peak detector and a slope detector monitor the peak-to-peak and slew rate of the voltage at the node vsup2_rep, respectively. Alternatively, the node vsup1_rep can be monitored by the peak-to-peak detector and the slope detector. If the outputs of either of the detectors go beyond their respective thresholds given by Vref1 and Vref2, the node vgMns which connects to the correspondingly labeled node of the stack/unstack controller in FIG. 14 goes high, triggering the unstack operation for amp1 and amp2. To control the PMOS switch, Mp2 in FIG. 14, vgMps is generated from vgMns as shown in FIG. 18.

FIG. 19 shows an embodiment of a peak-to-peak detector. Transistors Mn3 and Mn5 detect the peak of the signal vsup2_rep and transistors Mp3 and Mp5 detect the trough. The trough voltage is subtracted from the peak voltage and amplified using amp4 to generate vgMns. Signal vgMns is converted to current using amp5 and Mn6 and dropped across R2 to generate vgMps which is referenced to vdd. Signals vgMns and vgMps are used to control the switches in the stack/unstack controller of FIG. 14 and are connected to the correspondingly labeled nodes in FIG. 14.

FIG. 20 shows an embodiment of a slope detector that can be used in FIG. 18. Capacitor Cd, resistor R3 and the amp6 together perform the function of a differentiator, sensing the fast transient of high bandwidth envelope signals at vsup2_rep. Signals vgMns and vgMps can be used to unstack the amplifiers amp1 and amp2 in FIG. 12 by controlling switches S1, S2 and S3 when a fast change in vsup2_rep is detected.

Biasing the RF amplifiers is important for the stack/unstack operation. The RF amplifiers need to be biased properly to prevent power saturation. In the stacked operation, the currents in amp1 and amp2 of FIG. 1 match at all instantaneous power levels within the modulated envelope. Any current mismatch between amp1 and amp2 that is not corrected will cause a drift in the baseband voltage at the nodes vsup1 and vsup2 in FIG. 1. This can cause premature saturation in either amp1 or amp2, which reduces the amount of time spent in the stacked configuration thereby lowering the overall efficiency.

FIG. 21 shows a preferred embodiment of biasing the RF amplifiers, amp1 and amp2. Amp1 is biased in an open-loop fashion using the circuit, bias1. Amp2 is biased to match the current of amp1 using the bias circuit, bias2 which senses the voltage at the node vsup2 and compares it to Vref and then adjusts the d voltage of the amp2 input. Vref is chosen to keep amp2 in the linear operating region. In many cases Vref would be a DC reference, but in some embodiments Vref may be a signal that varies in response to factors such as power level, temperature, process corner, modulation type, or other factors. The bias2 feedback loop can be slow if amp1 and amp2 are matched and they are driven with the same input signal. An example when amp1 and amp2 would be matched is if both amp1 and amp2 are implemented using identical NMOS-based amplifiers and if the design is taken care to assure their gains remain matched. If amp1 and amp2 are not inherently matched, such as when amp1 is NMOS-based and amp2 is PMOS-based or if their input signals are different then the bias2 loop should be fast enough to track the envelope so that the currents in amp1 and amp2 will match at all instantaneous power levels within the modulated envelope.

FIG. 22 shows one implementation of bias2 shown in FIG. 21. The baseband amplifier amp4 output Vb2 controls the bias current of amp2 such that vsup2 matches Vref.

In FIG. 23, amp1 and amp2 are biased independently and they partially share the current. The amount of current shared is determined by the RF amplifier consuming the smallest current. A current compensator is used to compensate for the mismatch the two currents, keeping both amplifiers in the linear region of operation and minimizing the envelope voltage at the nodes vsup1 and vsup2. If the amp1 bias current is larger than the amp2 bias current, the current compensator will source the extra current needed by amp1. If at any point along the envelope the amp2 bias current is larger than amp1 bias current, the current compensator will sink the additional current from amp2. The current compensator detects the mismatch by monitoring the node vsup2. If the voltage at vsup2 increases, it will sink the current and reduces the voltage at vsup2. In this way, the current compensator regulates the vsup2 node to a chosen reference voltage that is optimized for linear operation in the stacked configuration. In preferred embodiments the current compensator reacts at the speed of the envelope to prevent delayed supply voltages at the nodes vsup1 and vsup2 and to prevent the premature saturation of amp1 and amp2 when stacked. It is possible however to design amp1 and amp2 with enough power supply rejection that envelope voltage on vsup1 and vsup2 can be tolerated.

In FIG. 23, the current compensator is connected to vsup2, but it could as well control vsup1 and achieve the same current compensation. The current compensator can also simultaneously control both voltages at vsup1 and vsup2. For example, the current compensator sinks current from vsup2 when amp2 has larger current than amp1, and it sources current into vsup1 when amp2 has smaller current than amp1.

FIG. 24 shows an embodiment of a current compensator. Its output node vsup2 (or vsup1) in FIG. 24 is connected to the node vsup2 (or vsup1) in FIG. 23. The output voltage at vsup2 (or vsup1) in FIG. 24 is regulated by a feedback loop using the baseband amplifier amp5. The voltage Vref5 is optimized for linearity in the stacked configuration of amp1 and amp2. The PMOS transistor Mp6 is sized to source the maximum amount of mismatch current expected. The NMOS transistor Mn6 is sized to sink the maximum mismatch current expected. The supply vdd and ground gnd can be same or independent of the supplies vddU, vddS and grounds gndU, gndS shown in FIG. 23. However, the reference voltage Vref5 need to be referred to the supply vddS and ground gndS of amp1 and amp2 shown in FIG. 23.

The embodiments of the invention described above are intended to be merely exemplary; numerous variations and modifications will be apparent to those skilled in the art. Such variations and modifications are intended to be within the scope of the present invention as defined by any of the appended claims.

Various embodiments of the present invention may be characterized by the potential claims listed in the paragraphs following this paragraph (and before the actual claims provided at the end of the application). These potential claims form a part of the written description of the application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public. Nor are these potential claims intended to limit various pursued claims.

Without limitation, some potential subject matter that may be claimed (prefaced with the letter "P" so as to avoid confusion with the actual claims presented below) includes:

P1. An apparatus comprising:
a first amplifier;
a second amplifier;
a switching configuration operatively coupled with the first and second amplifiers,
the switching configuration configured to dynamically switch the first and second amplifiers between a stacked and unstacked configuration as a function of an input signal.

P2. The apparatus of innovation P1 wherein the first amplifier is an NMOS amplifier and the second amplifier is a PMOS amplifier.

P3. The apparatus of any one or more of the above innovations further comprising at least one additional amplifier, the switching configuration configured to dynamically switch the first, second, and at least one additional amplifier between a stacked and unstacked configuration as a function of the input signal.

P4. The apparatus of any one or more of the above innovations wherein the first amplifier has a power supply input and the second amplifier has a ground input coupled with the power supply input of the first amplifier.

Without limitation, some additional potential subject matter that may be claimed (prefaced with the letter "P" so as to avoid confusion with the actual claims presented below) includes:

P1. A method for reducing the current of an RF power amplifier system with first and second RF amplifiers includes:
sensing signals in at least one of the first and second RF amplifiers and deciding whether the power amplifier system would operate linearly when said first and second RF amplifiers are in a stacked configuration and generating one or more mode-control signals representative thereof,
configuring the first and second RF amplifiers in a stacked configuration between first positive and first negative power supplies in response to said one or more mode-control signals when said mode-control signals indicate that the power amplifier system would operate linearly when said first and second RF amplifiers are stacked,
configuring the first and second RF amplifiers in an unstacked configuration between second positive and second negative power supplies in response to said one or more mode-control signals when said mode-control signals indicate that the power amplifier system would not operate linearly when said first and second RF amplifiers are stacked,
moving the first and second RF amplifiers between stacked and unstacked configurations in response to said one or more mode-control signals in order to maintain linearity in the power amplifier system, and
wherein DC currents from said second positive power supply and to said second negative power supplies are greatly reduced in said stacked configuration relative to said unstacked configuration.

P2. The embodiment of claim P1 wherein said second negative power supply is a virtual ground node within said first RF amplifier.

P3. The embodiment of claim P1 wherein said second positive power supply is a virtual ground node within said second RF amplifier.

P4. The embodiment of claim P1 wherein said first RF amplifier comprises a NMOS common source amplifier.

P5. The embodiment of claim P1 wherein said first RF amplifier is a 2-stack NMOS amplifier.

P6. The embodiment of claim P1 wherein said first RF amplifier is a 3-stack NMOS amplifier.

P7. The embodiment of claim P1 wherein said second RF amplifier is a PMOS common source amplifier.

P8. The embodiment of claim P1 wherein said second RF amplifier is a 2-stack PMOS amplifier.

P9. The embodiment of claim P1 wherein said second RF amplifier is a 3-stack PMOS amplifier.

P10. The embodiment of claim P1 wherein said one or more mode-control inputs is a dynamic signal that varies in response to the modulation envelope of at least one of said first or second RF input signals.

P11. The embodiment of claim P1 wherein said one or more mode-control inputs is a static signal with respect to the modulation envelope.

P12. The embodiment of claim P1 further comprising one or more RF connections between said first and second RF amplifiers.

P13. A method for reducing the current of an RF power amplifier system with first and second RF amplifiers includes:
receiving a mode-control signal indicative of whether said RF power amplifier system would operate linearity if said first and second RF amplifiers are stacked and selecting either stacked or unstacked modes responsive to the mode-control signal,
configuring the first and second RF amplifiers in an unstacked configuration between second positive and second negative power supplies in response to said mode-control signal when said mode-control signal selects an unstacked mode,
configuring the first and second RF amplifiers in a stacked configuration between first positive and first negative power supplies in response to said mode-control signal when said mode-control signal selects a stacked mode so as to greatly reduce DC current from said second positive power supply and into said second negative power supply, and
moving the first and second RF amplifiers between stacked and unstacked configurations in response to changes in said mode-control signal.

P14. In accordance with embodiments of the invention, an apparatus for reducing the current of an RF power amplifier system includes:
A first RF amplifier for amplifying a first RF input signal and generating a first RF output signal,
A second RF amplifier for amplifying a second RF input signal and generating a second RF output signal,
A stack/unstack controller operable for moving between stacked and unstacked operating states in response to one or more mode-control inputs
wherein said first RF amplifier is coupled to a first negative power supply and is coupled through one or more first stack-control signals to the stack/unstack controller, said second RF amplifier is coupled to a first positive power supply and is coupled through one or more second stack-control signals to the stack/unstack controller, said stack/unstack controller is coupled to said first and second stack-control signals and is coupled to a second positive power supply and a second negative power supply, said stack/unstack controller operates on said first and second stack-control signals and configures the first and second amplifiers in a stacked configuration between the first positive and first negative power supplies when the one-or-more mode-control inputs specifies the stacked configuration, said stack/unstack controller operates on said first and second stack-control signals and configures the first and second amplifiers in an unstacked configuration between the second positive and second negative power supplies when the one-or-more mode-control inputs specifies the unstacked configuration, said stack/unstack controller moves the first and second amplifiers between the stacked and unstacked configurations in response to changes in the one-or-more mode-control inputs.

P15. The embodiment of claim P14 wherein the DC currents from said second power supply and to said first power supply are greatly reduced when said first and second RF power amplifiers are in the stacked configuration.

P16. The embodiment of claim P14 wherein said second negative power supply is the same as said first negative power supply.

P17. The embodiment of claim P14 wherein said second positive power supply is the same as said first positive power supply.

P18. The embodiment of claim P14 wherein said second negative power supply is a virtual ground node within said first RF amplifier.

P19. The embodiment of claim P14 wherein said second positive power supply is a virtual ground node within said second RF amplifier.

P20. The embodiment of claim P14 wherein said power combiner comprises a transformer.

P21. The embodiment of claim P14 wherein said power combiner comprises a lumped element matching network P22. The embodiment of claim P14 wherein said first RF amplifier comprises a NMOS common source amplifier.

P23. The embodiment of claim P14 wherein said first RF amplifier is a 2-stack NMOS amplifier.

P24. The embodiment of claim P14 wherein said first RF amplifier is a 3-stack NMOS amplifier.

P25. The embodiment of claim P14 wherein said second RF amplifier is a PMOS common source amplifier.

P26. The embodiment of claim P14 wherein said second RF amplifier is a 2-stack PMOS amplifier.

P27. The embodiment of claim P14 wherein said second RF amplifier is a 3-stack PMOS amplifier.

P28. The embodiment of claim P14 wherein said one or more mode-control inputs is a dynamic signal that varies in response to the modulation envelope of at least one of said first or second RF input signals.

P29. The embodiment of claim P14 wherein said one or more mode-control inputs is a static signal with respect to the modulation envelope.

P30. The embodiment of claim P14 wherein said stack/unstack controller comprises switches to move said first and second stack-control signals toward said second positive and second negative power supplies when said one or more mode-control inputs specify an unstacked configuration.

P31. The embodiment of claim P14 wherein said stack/unstack controller comprises FETs to provide additional current to said first and second RF amplifiers when said one or more mode-control inputs specify an unstacked configuration.

P32. The embodiment of claim P14 wherein said stack/unstack controller comprises a switch to provide a DC current path between said first and second RF amplifiers when said one or more mode-control inputs specify a stacked configuration.

P33. The embodiment of claim P14 wherein said stack/unstack controller comprises a diode to provide a DC current path between said first and second RF amplifiers when said one or more mode-control inputs specify a stacked configuration.

P34. The embodiment of claim P14 further comprising a linearity detector, said linearity detector operable to detect whether said first and second RF amplifiers would be operating linearly in a stacked configuration and to generate said one or more mode-control inputs responsive to that condition.

P35. The embodiment of claim P34 wherein said linearity detector comprises one or more peak detectors operable to generate an envelope signal representative of the envelope of said first RF output signal.

P36. The embodiment of claim P34 wherein said linearity detector comprises one or more peak detectors operable to generate an envelope signal representative of the envelope of said second RF output signal.

P37. The embodiment of claim P34 wherein said linearity detector comprises a slope detector.

P38. The embodiment of claim P14 further comprising bias circuitry to control the DC voltage of said first and second RF outputs when said first and second amplifiers are in a stacked configuration.

P39. The embodiment of claim P14 further comprising a current compensator to allow independent control of the bias currents in said first and second RF amplifiers when said first and second RF amplifiers are in a stacked configuration.

P40. An apparatus for reducing the current of an RF power amplifier system including:

a first RF amplifier for amplifying a first RF input signal and generating a first RF output signal, a second RF amplifier for amplifying a second RF input signal and generating a second RF output signal, a linearity detector for detecting when the RF outputs of said first and second amplifiers would be sufficiently linear when said first and second RF amplifiers are configured in a stacked configuration and generating one or more mode-control signals representative thereof, a stack/unstack controller operable for configuring said first and second RF amplifiers in either stacked or unstacked operating states and for moving said first and second RF amplifiers between said stacked and unstacked operating states in response to said one or more mode-control signals, wherein:

said first RF amplifier is coupled to a first negative power supply and is coupled through one or more first stack-control signals to the stack/unstack controller, said second RF amplifier is coupled to a first positive power supply and is coupled through one or more second stack-control signals to the stack/unstack controller, said linearity detector receives one or more RF input signals from at least one of the first or second RF amplifiers, said stack/unstack controller is coupled to a second positive and second negative power supplies, said stack/unstack controller operates on said first and second stack-control signals to configure the first and second RF amplifiers in a stacked configuration between the first positive and first negative power supplies when said one or more mode-control signals indicates that sufficient linearity would be achieved from the RF power amplifier system with said first and second RF amplifiers in a stacked configuration, said stack/unstack controller operates on said first and second stack-control signals from the first and second RF amplifiers and configures the first and second amplifiers in an unstacked configuration between the second positive and second negative power supplies when said one or more mode-control signals indicates that sufficient linearity would not be achieved in a stacked configuration, said stack/unstack controller moves the first and second RF amplifiers between the stacked and unstacked configurations so as to maintain linearity in the first and second RF amplifiers.

P41. The embodiment of claim P40 wherein DC currents from said second positive power supply and into said second negative power supply are greatly reduced when said first and second RF amplifiers are in the stacked configuration.

P42. The embodiment of claim P40 wherein said second negative power supply is the same as said first negative power supply.

P43. The embodiment of claim P40 wherein said second positive power supply is the same as said first positive power supply.

P44. The embodiment of claim P40 wherein said second negative power supply is a virtual ground node within said first RF amplifier.

P45. The embodiment of claim P40 wherein said second positive power supply is a virtual ground node within said second RF amplifier.

P46. The embodiment of claim P40 further comprising a power combiner operable to combine the powers in said first and second RF outputs into a single RF signal.

P47. The embodiment of claim P40 wherein said one or more mode-control signals specify a stacked configuration when both of said first and second RF amplifiers would operate linearly when in a stacked configuration and wherein said one or more mode-control signals specify an unstacked configuration when either of said first and second RF amplifiers would operate nonlinearly when in a stacked configuration.

P48. The embodiment of claim P46 wherein said power combiner comprises a lumped element matching network.

P49. The embodiment of claim P46 wherein said power combiner comprises a transformer.

P50. The embodiment of claim P40 wherein said first RF amplifier is an NMOS amplifier.

P51. The embodiment of claim P40 wherein said second RF amplifier is a PMOS amplifier.

P52. The embodiment of claim P40 wherein said one or more mode-control inputs is a dynamic signal that varies in response to the modulation envelope of at least one of said first or second RF input signals.

P53. The embodiment of claim P40 further comprising one or more RF connections between said first and second amplifiers P54. The embodiment of claim P53, wherein said one or more RF connections provide the path for DC current to flow when in stacked mode P55. An apparatus for reducing the current of an RF power amplifier system including:

a first RF amplifier for amplifying a first RF input signal and generating a first RF output signal, a second RF amplifier for amplifying a second RF input signal and generating a second RF output signal, a linearity detector for detecting when the RF power amplifier system would be sufficiently linear when said first and second RF amplifiers are configured in a stacked configuration and generating one or more mode-control signals representative thereof, a stack/unstack controller operable for configuring said first and second RF amplifiers in either stacked or unstacked operating states and for moving said first and second RF amplifiers between said stacked and unstacked operating states in response to said one or more mode-control signals, wherein:

a majority of DC current of said first and second RF amplifiers is shared when in said stacked operating state, a majority of DC current of said first and second RF amplifiers is not shared when in said unstacked operating state.

What is claimed is:

1. A reduced current RF power amplifier system comprising:
   a first RF amplifier for amplifying a first RF input signal and generating a first RF output signal;
   a second RF amplifier for amplifying a second RF input signal and generating a second RF output signal; and
   a stack/unstack controller including circuitry configured to switch the RF power amplifier system between a stacked mode in which said first and second RF amplifiers are coupled in a stacked configuration and an unstacked mode in which said first and second RF amplifiers are coupled in an unstacked configuration in response to one or more mode-control signals, the stacked configuration providing reduced current compared to the unstacked configuration.

2. A system according to claim 1, wherein:
   a majority of DC current of said first and second RF amplifiers is shared when in said stacked configuration; and
   a majority of DC current of said first and second RF amplifiers is not shared when in said unstacked configuration.

3. A system according to claim 1, wherein the stack/unstack controller is configured to switch the first and second RF amplifiers between the stacked and unstacked configurations in a manner that maintains linearity in the first and second RF amplifiers.

4. A system according to claim 1, wherein:
   the first RF amplifier is coupled to a first negative power supply and is coupled through one or more first stack-control signals to the stack/unstack controller;
   the second RF amplifier is coupled to a first positive power supply and is coupled through one or more second stack-control signals to the stack/unstack controller; and
   the stack/unstack controller is coupled to a second positive power supply and to a second negative power supply, wherein:
   the stack/unstack controller operates on said first and second stack-control signals to couple the first and second RF amplifiers in the stacked configuration between the first positive and first negative power supplies when the one or more mode-control signals indicate the stacked mode; and the stack/unstack controller operates on said first and second stack-control signals from the first and second RF amplifiers to couple the first and second RF amplifiers in the unstacked configuration between the second positive and second negative power supplies when the one or more mode-control signals indicate the unstacked mode.

5. A system according to claim 4, wherein said stack/unstack controller comprises switches to move said first and second stack-control signals toward said second positive and second negative power supplies when said one or more mode-control inputs identify the unstacked mode.

6. A system according to claim 4, wherein said second negative power supply is the same as said first negative power supply and said second positive power supply is the same as said first positive power supply.

7. A system according to claim 1, wherein said first RF amplifier comprises a NMOS amplifier and wherein said second RF amplifier comprises a PMOS amplifier.

8. A system according to claim 1, wherein each of said one or more mode-control inputs is a dynamic signal that varies in response to the modulation envelope of at least one of said first or second RF input signals.

9. A system according to claim 1, further comprising:
one or more RF connections between said first and second RF amplifiers, wherein said one or more RF connections provide a path for DC current to flow when in the stacked configuration.

10. A system according to claim 1, further comprising:
a linearity detector configured to detect if the RF power amplifier system would meet predetermined linearity performance criteria in the stacked configuration, wherein the one or more mode-control signals are generated as a function of such linearity detection.

11. A system according to claim 10, wherein the linearity detector is configured to detect if the RF outputs of said first and second RF amplifiers would meet predetermined linearity performance criteria in the stacked configuration.

12. A system according to claim 10, wherein said linearity detector comprises one or more peak detectors operable to generate an envelope signal representative of the envelope of one or more of said first and second RF output signals.

13. A system according to claim 1, further comprising:
a power tracker configured to monitor a baseband system power code, wherein the one or more mode-control signals are generated as a function of such baseband system power code monitoring.

14. A system according to claim 1, wherein said stack/unstack controller comprises FETs to provide additional current to said first and second RF amplifiers when said one or more mode-control inputs specify an unstacked configuration.

15. A system according to claim 1, wherein said stack/unstack controller comprises a switch or diode to provide a DC current path between said first and second RF amplifiers when said one or more mode-control inputs specify a stacked configuration.

16. A system according to claim 1, further comprising bias circuitry to control the DC voltage of said first and second RF outputs when said first and second amplifiers are in a stacked configuration.

17. A method of reducing the current of an RF power amplifier system having first and second RF amplifiers and a stack/unstack controller including circuitry configured to switch the RF power amplifier system between a stacked mode in which said first and second RF amplifiers are coupled in a stacked configuration and an unstacked mode in which said first and second RF amplifiers are coupled in an unstacked configuration in response to one or more mode-control signals, the stacked configuration providing reduced current compared to the unstacked configuration, the method comprising:
receiving, by the stack/unstack controller, one or more mode-control signals; and
switching, by the stack/unstack controller, the first and second RF amplifiers into the mode indicated by the mode-control signal.

18. A method according to claim 17, further comprising:
detecting if the RF power amplifier system would meet predetermined linearity performance criteria in the stacked configuration; and
generating the one or more mode-control signals as a function of such linearity detection.

19. A method according to claim 17, further comprising:
monitoring a baseband system power code; and
generating the one or more mode-control signals as a function of such baseband system power code monitoring.

20. A method according to claim 17, wherein each of said one or more mode-control inputs is a dynamic signal that varies in response to the modulation envelope of at least one of said first or second RF input signals.

* * * * *